(12) United States Patent
Zhou et al.

(10) Patent No.: US 12,542,079 B2
(45) Date of Patent: Feb. 3, 2026

(54) DISPLAY MOTHERBOARD, TEST METHOD THEREFOR, DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Zhenli Zhou, Beijing (CN); Fengli Ji, Beijing (CN); Chengjie Qin, Beijing (CN); Yanwei Lu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 18/695,368

(22) PCT Filed: Aug. 10, 2023

(86) PCT No.: PCT/CN2023/112185
§ 371 (c)(1),
(2) Date: Mar. 26, 2024

(87) PCT Pub. No.: WO2024/055786
PCT Pub. Date: Mar. 21, 2024

(65) Prior Publication Data
US 2024/0395183 A1 Nov. 28, 2024

(30) Foreign Application Priority Data
Sep. 16, 2022 (CN) .......................... 202211130253.1

(51) Int. Cl.
*G09G 3/00* (2006.01)
*G09G 3/20* (2006.01)
(Continued)

(52) U.S. Cl.
CPC ........... *G09G 3/006* (2013.01); *G09G 3/2096* (2013.01); *G09G 3/3233* (2013.01);
(Continued)

(58) Field of Classification Search
CPC .... G09G 3/006; G09G 3/2096; G09G 3/3233; G09G 2320/04; H10K 59/131; H10K 59/1201
(Continued)

(56) References Cited

U.S. PATENT DOCUMENTS 9,595,213 B2 * 3/2017 Kim ........................ G09G 3/006
2008/0198286 A1 * 8/2008 Wu ......................... G09G 3/006
349/40
(Continued)

FOREIGN PATENT DOCUMENTS

CN 105430882 A 3/2016
CN 108257540 A 7/2018
(Continued)

OTHER PUBLICATIONS

Office Action dated Jan. 26, 2025 for CN202211130253.1 and English Translation.
(Continued)

*Primary Examiner* — Kwin Xie
(74) *Attorney, Agent, or Firm* — Ling Wu; Stephen Yang; Ling and Yang Intellectual Property

(57) ABSTRACT

A display motherboard comprises at least one substrate region; the substrate region comprises at least one test pad region, at least one test wire region and at least two display substrates; the test pad region comprises a plurality of pads; the test wire region comprises a plurality of signal wires, first ends of the plurality of signal wires being correspondingly connected to the plurality of pads, and second ends of the plurality of signal wires extending to the display sub-
(Continued)

strates in the substrate region, so as to be connected to test circuits of the display substrates; the plurality of pads are configured to allow an external test device to provide, by means of the plurality of pads, test signals to the test circuits of the display substrates in the substrate region, so as to simultaneously perform light-on tests or aging procedures on the display substrates in the substrate region.

19 Claims, 12 Drawing Sheets

(51) Int. Cl.
    *G09G 3/3233*     (2016.01)
    *H10K 59/12*     (2023.01)
    *H10K 59/131*     (2023.01)

(52) U.S. Cl.
    CPC ....... *H10K 59/1201* (2023.02); *H10K 59/131* (2023.02); *G09G 2320/043* (2013.01)

(58) Field of Classification Search
    USPC .......................................................... 345/204
    See application file for complete search history.

(56) References Cited

U.S. PATENT DOCUMENTS

| | | | |
|---|---|---|---|
| 2015/0241501 A1* | 8/2015 | Jang | G09G 3/006 |
| | | | 324/527 |
| 2018/0226467 A1* | 8/2018 | Ka | H10K 59/12 |
| 2020/0185483 A1* | 6/2020 | Peng | H10K 71/70 |

FOREIGN PATENT DOCUMENTS

| | | | | |
|---|---|---|---|---|
| CN | 110189706 A | | 8/2019 | |
| CN | 210575959 U | | 5/2020 | |
| CN | 113594220 A | | 11/2021 | |
| CN | 114361187 A | | 4/2022 | |
| CN | 114495821 A | | 5/2022 | |
| CN | 114999417 A | | 9/2022 | |
| CN | 115312577 A | | 11/2022 | |
| JP | 2011-95099 A | | 5/2011 | |
| KR | 20180091994 A | * | 8/2018 | ......... H01L 51/0031 |
| KR | 20210041659 A | | 4/2021 | |

OTHER PUBLICATIONS

International Search Report for PCT/CN2023/112185 Mailed Oct. 27, 2023.

* cited by examiner

US 12,542,079 B2

DISPLAY MOTHERBOARD, TEST METHOD THEREFOR, DISPLAY SUBSTRATE AND DISPLAY APPARATUS

CROSS-REFERENCE TO RELATED APPLICATIONS

The present application is a U.S. National Phase Entry of International Application PCT/CN2023/112185 having an international filing date of Aug. 10, 2023, which claims priority of Chinese patent application No. 202211130253.1, filed to the CNIPA on Sep. 16, 2022 and entitled "Display Motherboard, Test Method Therefor, Display Substrate and Display Apparatus", contents of which should be construed as being incorporated into the present application by reference in their entireties.

TECHNICAL FIELD

The present disclosure relates to, but is not limited to, the field of display technologies, and particularly relates to a display motherboard, a test method of the display motherboard, a display substrate and a display apparatus.

BACKGROUND

An Organic Light Emitting Diode (OLED for short) and a Quantum dot Light Emitting Diode (QLED for short) are active light emitting display devices and have advantages such as self-luminescence, wide viewing angle, high contrast ratio, low power consumption, and a very high response speed. With continuous development of display technologies, a display apparatus in which an OLED or a QLED is used as a light emitting device and a Thin Film Transistor (TFT) is used for signal control has become a mainstream product in the field of display at present.

SUMMARY

The following is a summary of subject matter described herein in detail. The summary is not intended to limit the scope of protection of the claims.

In one aspect, an exemplary embodiment of the present disclosure provides a display motherboard, including at least one substrate area, wherein each substrate area including at least one test pad region, at least one test wire region and at least two display substrates, each display substrate includes a display area and a bonding area located on a side of the display area, the display area includes multiple sub-pixels, the bonding area includes at least a cell test circuit and multiple test pins, the cell test circuit is connected to the multiple test pins and the multiple sub-pixels; the test pad region includes multiple pads, the test wire region includes multiple signal wires, first ends of the multiple signal wires are connected correspondingly to the multiple pads, second ends of the multiple signal wires extend to a bonding area of the display substrate in the substrate area and are connected correspondingly to the multiple test pins of the display substrate, the multiple pads are configured to enable an external test device to provide test signals to the cell test circuit of each display substrate in the substrate area through the multiple pads, and simultaneously perform a light-on test or an aging procedure on each display substrate in the substrate area.

In an exemplary implementation, the substrate area at least includes a first display substrate and a second display substrate sequentially provided along a first direction, the test wire region is provided on a side of the first display substrate and the second display substrate in a second direction, the test pad region is provided on a side of the second display substrate away from the first display substrate, or the test pad region is provided on a side of the first display substrate away from the second display substrate, and the first direction intersects with the second direction.

In an exemplary implementation, the test pad region at least includes a first pad, a second pad, a third pad, and a fourth pad; the test wire region at least includes a first power supply wire, a second power supply wire, a third power supply wire, and a fourth power supply wire; a first end of the first power supply wire is connected to the first pad, a second end of the first power supply wire extends to the first display substrate and is connected to a test pin of the first display substrate, and the first pad is configured to enable the external test device to provide a first power supply signal to the first display substrate through the first pad; a first end of the second power supply wire is connected to the second pad, a second end of the second power supply wire extends to the second display substrate and is connected to a test pin of the second display substrate, and the second pad is configured to enable the external test device to provide a first power supply signal to the second display substrate through the second pad; a first end of the third power supply wire is connected to the third pad, a second end of the third power supply wire extends to the first display substrate and is connected to a test pin of the first display substrate, and the third pad is configured to enable the external test device to provide a second power supply signal to the first display substrate through the third pad; a first end of the fourth power supply wire is connected to the fourth pad, a second end of the fourth power supply wire extends to the second display substrate and is connected to a test pin of the second display substrate, and the fourth pad is configured to enable the external test device to provide a second power supply signal to the second display substrate through the fourth pad.

In an exemplary implementation, at least one signal wire of the test wire region is in a single-layer wire structure, or a double-layer wire structure, or a wire structure of more than three layers.

In an exemplary implementation, the first power supply wire and the third power supply wire are provided on a side of the second power supply wire and the fourth power supply wire away from the display substrate.

In an exemplary implementation, a width of the first power supply wire is greater than a width of the second power supply wire, and a width of the third power supply wire is greater than a width of the fourth power supply wire, and a width is a smallest dimension of each of the first power supply wire, the second power supply wire, the third power supply wire, and the fourth power supply wire in the second direction respectively.

In an exemplary implementation, the test pad region further includes a fifth pad and a sixth pad and the test wire region further includes a fifth power supply wire and a sixth power supply wire; a first end of the fifth power supply wire is connected to the fifth pad, a second end of the fifth power supply wire is connected to test pins of the first display substrate and the second display substrate respectively after extending to the first display substrate and the second display substrate, and the fifth pad is configured to enable the external test device to provide a high-level signal to the first display substrate and the second display substrate through the fifth pad; and a first end of the sixth power supply wire is connected to the sixth pad, a second end of the sixth power supply wire is connected to test pins of the first display substrate and the second display substrate respectively after extending to the first display substrate and the second display substrate, and the sixth pad is configured to enable the external test device to provide a low-level signal to the first display substrate and the second display substrate through the sixth pad.

In an exemplary implementation, the fifth power supply wire and the sixth power supply wire are provided on a side of the second power supply wire close to the display substrate.

In an exemplary implementation, the test pad region further includes an eleventh pad, a twelfth pad, a thirteenth pad, and a fourteenth pad; the test wire region further includes an eleventh power supply wire, a twelfth power supply wire, a thirteenth power supply wire, and a fourteenth power supply wire; a first end of the eleventh power supply wire is connected to the eleventh pad, a second end of the eleventh power supply wire extends to the first display substrate and is connected to a test pin of the first display substrate, and the eleventh pad is configured to enable the external test device to provide a first initial signal to the first display substrate through the eleventh pad; a first end of the twelfth power supply wire is connected to the twelfth pad, a second end of the twelfth power supply wire extends to the second display substrate and is connected to a test pin of the second display substrate, and the twelfth pad is configured to enable the external test device to provide a first initial signal to the second display substrate through the twelfth pad; a first end of the thirteenth power supply wire is connected to the thirteenth pad, a second end of the thirteenth power supply wire extends to the first display substrate and is connected to a test pin of the first display substrate, and the thirteenth pad is configured to enable the external test device to provide a second initial signal to the first display substrate through the thirteenth pad; and a first end of the fourteenth power supply wire is connected to the fourteenth pad, a second end of the fourteenth power supply wire extends to the second display substrate and is connected to a test pin of the second display substrate, and the fourteenth pad is configured to enable the external test device to provide a second initial signal to the second display substrate through the fourteenth pad.

In an exemplary implementation, the eleventh power supply wire, the twelfth power supply wire, and the fourteenth power supply wire are provided on a side of the second power supply wire close to the display substrate and the thirteenth power supply wire is provided on a side of the third power supply wire away from the display substrate.

In an exemplary implementation, a width of the eleventh power supply wire is greater than a width of the twelfth power supply wire, a width of the thirteenth power supply wire is greater than a width of the fourteenth power supply wire, and a width is a smallest dimension of each of the eleventh power supply wire, the twelfth power supply wire, the thirteenth power supply wire, and the fourteenth power supply wire in the second direction respectively.

In an exemplary implementation, the test pad region further includes a first pad group, a second pad group, a third pad group, a fourth pad group, and a fifth pad group and the test wire region further includes a first wire group, a second wire group, a third wire group, a fourth wire group, and a fifth wire group; first ends of multiple signal wires in the first wire group are connected correspondingly to multiple pads in the first pad group, second ends of the multiple signal wires in the first wire group extend to the second display substrate and are connected correspondingly to multiple test pins of the second display substrate, and the first pad group is configured to enable the external test device to provide a test signal to the second display substrate through the first pad group; first ends of multiple signal wires in the second wire group are connected correspondingly to multiple pads in the second pad group, second ends of the multiple signal wires in the second wire group extend to the first display substrate and are connected correspondingly to multiple test pins of the first display substrate, and the second pad group is configured to enable the external test device to provide a test signal to the first display substrate through the second pad group; first ends of multiple signal wires in the third wire group are connected correspondingly to multiple pads in the third pad group, second ends of the multiple signal wires in the third wire group extend to the first display substrate and the second display substrate and are connected correspondingly to multiple test pins of the first display substrate and the second display substrate respectively, and the third pad group is configured to enable the external test device to provide a selection signal to the first display substrate and the second display substrate through the third pad group; first ends of multiple signal wires in the fourth wire group are connected correspondingly to multiple pads in the fourth pad group, second ends of the multiple signal wires in the fourth wire group extend to the first display substrate and the second display substrate and are connected correspondingly to multiple test pins of the first display substrate and the second display substrate respectively, and the fourth pad group is configured to enable the external test device to provide a gate drive signal to the first display substrate and the second display substrate through the fourth pad group; and first ends of multiple signal wires in the fifth wire group are connected correspondingly to multiple pads in the fifth pad group, second ends of the multiple signal wires in the fifth wire group extend to the first display substrate and the second display substrate and are connected correspondingly to multiple test pins of the first display substrate and the second display substrate respectively, and the fifth pad group is configured to enable the external test device to provide a test switch signal to the first display substrate and the second display substrate through the fifth pad group.

In an exemplary implementation, the second wire group is provided on a side of the first wire group away from the display substrate, the third wire group is provided on a side of the second wire group away from the display substrate, the fourth wire group is provided on a side of the third wire group away from the display substrate, and the fifth wire group is provided between the fifth power supply wire and the sixth power supply wire.

In an exemplary implementation, the test pad region further includes multiple electrostatic discharge units, first ends of the multiple electrostatic discharge units are connected respectively to multiple pads in the first pad group, the second pad group, the third pad group, the fourth pad group, and the fifth pad group, and second ends of the multiple electrostatic discharge units are connected respectively to first ends of multiple signal wires in the first wire group, the second wire group, the third wire group, the fourth wire group, and the fifth wire group.

In an exemplary implementation, at least one of the pads has a rectangular shape, a length L of the pad is 300 μm to 1200 μm, a width of the pad is 80 μm to 1200 μm, and a spacing between adjacent pads is 150 μm to 1500 μm, the length and the spacing are average dimensions in an arrangement direction of the multiple pads, and the width is an average dimension in a direction perpendicular to the arrangement direction of the multiple pads.

In an exemplary implementation, the pads include probe-type pads, a length of each probe-type pad is 400 µm to 1200 µm, a width of the probe-type pad is 400 µm to 1200 µm, and a spacing between adjacent probe-type pads is 100 µm to 1500 µm.

In an exemplary implementation, the pads include crimping-type pads, a length of each crimping-type pad is 300 µm to 1000 µm, a width of the crimping-type pad is 80 µm to 250 µm, and a spacing between adjacent crimping-type pads is 50 µm to 300 µm.

In another aspect, an exemplary embodiment of the present disclosure further provides a test method of a display motherboard, the display motherboard is the aforementioned display motherboard, the test method including:

an external test device is connected to multiple pads in at least one substrate area, a light-on test signal or an aging procedure signal are provided to cell test circuits of the multiple display substrates in the substrate area through the multiple pads, and simultaneously performs the light-on test or the aging procedure on the multiple display substrates in the substrate area.

In another aspect, an exemplary embodiment of the present disclosure further provides a display substrate, and the display substrate is configured to be formed by cutting the aforementioned display motherboard.

In another aspect, an embodiment of the present disclosure further provides a display apparatus, including the display substrate described above.

Other aspects may be comprehended upon reading and understanding drawings and detailed description.

BRIEF DESCRIPTION OF DRAWINGS

Accompanying drawings are used for providing further understanding of technical solutions of the present disclosure, constitute a part of the specification, and are used for explaining the technical solutions of the present disclosure together with embodiments of the present disclosure, but do not constitute limitations on the technical solutions of the present disclosure. Shapes and sizes of various components

Figure 1:
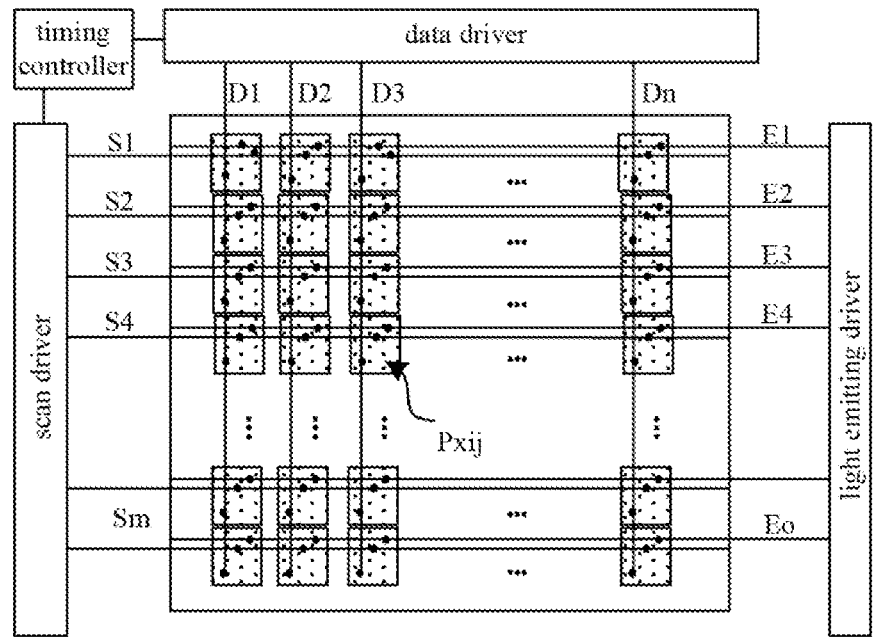
FIG. 1 is a schematic diagram of a structure of a display apparatus.

| Reference signs are described as follows. | | |
| --- | --- | --- |
| 10-test unit | 11-first insulation layer | 12-second insulation layer |
| 20-control line | 21-first gate metal layer | 22-second gate metal layer |
| 23-first source-drain metal layer | 30-test line | 40-electrostatic discharge unit |
| 100-display area | 101-base substrate | 102-drive circuit layer |
| 103-light emitting structure layer | 104-encapsulation structure layer | 200-bonding area |
| 300-bezel area | 400-display motherboard | 500-display substrate |
| 510-first display substrate | 520-second display substrate | 530-test pin |
| 600-cutting area | 700-substrate area | 701-cell test circuit |
| 702-test pin | 710-test pad region | 720-test wire region |
| 800-pad, | 801-first pad | 802-second pad |
| 803-third pad | 804-fourth pad | 805-fifth pad |
| 806-sixth pad | 811-eleventh pad | 812-twelfth pad |
| 813-thirteenth pad | 814-fourteenth pad | 810-first pad group |
| 820-second pad group | 830-third pad group | 840-fourth pad group |
| 850-fifth pad group | 900-signal wire | 901-first power supply wire |
| 902-second power supply wire | 903-third power supply wire | 904-fourth power supply wire |
| 905-fifth power supply wire | 906-sixth power supply wire | 911-eleventh power supply wire |
| 912-twelfth power supply wire | 913-thirteenth power supply wire | 914-fourteenth power supply wire |
| 910-first wire group | 920-second wire group | 930-third wire group |
| 940-fourth wire group | 950-fifth wire group. | | in the drawings do not reflect actual scales, but are only intended to schematically illustrate contents of the present disclosure.

FIG. 1 is a schematic diagram of a structure of a display apparatus.

DETAILED DESCRIPTION

To make the objectives, technical solutions, and advantages of the present disclosure clearer, the embodiments of the present disclosure will be described in detail below with reference to the accompany drawings. It is to be noted that the implementations may be implemented in various forms. Those of ordinary skills in the art can easily understand such a fact that implementations and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one implementation of the present disclosure is not limited to shapes, numerical values, or the like shown in the drawings.

Ordinal numerals "first", "second", "third", etc., in the specification are set not to form limits in numbers but only to avoid confusion between composition elements.

In the specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limitations on the present disclosure. The positional relationships between the composition elements may be changed as appropriate according to a direction according to which each composition element is described. Therefore, appropriate replacements based on situations are allowed, which is not limited to the expressions in the specification.

In the specification, unless otherwise specified and defined, terms "mounting", "mutual connection", and "connection" should be understood in a broad sense. For example, a "connection" may be a fixed connection, a detachable connection, or an integral connection; it may be a mechanical connection or an electrical connection; it may be a direct connection, an indirect connection through a middleware, or internal communication inside two elements. Those of ordinary skills in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In cases that transistors with opposite polarities are used, or a current direction changes during operation of a circuit, or the like, functions of the "source electrode" and the "drain electrode" are sometimes interchangeable. Therefore, the "source electrode" and the "drain electrode" are interchangeable in the specification.

In the specification, a "connection" includes a case where constitute elements are connected together through an element with a certain electrical action. An "element with a certain electrical action" is not particularly limited as long as electric signals between the connected composition elements may be sent and received. Examples of the "element with the certain electrical action" not only include an electrode and a wire, but also include a switch element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the present disclosure, "about" refers to that a boundary is not defined so strictly and numerical values within a range of process and measurement errors are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively. The data driver is connected with multiple data signal lines (D1 to Dn) respectively. The scan driver is connected to multiple scan signal lines (S1 to Sm) respectively. The light emitting driver is connected to multiple light emitting signal lines (E1 to Eo) respectively. The pixel array may include multiple sub-pixels Pxij, wherein i and j may be natural numbers. At least one sub-pixel Pxij may include a circuit unit and a light emitting device connected to the circuit unit, wherein the circuit unit may at least include a pixel drive circuit, and the pixel drive circuit is connected to a scan signal line, a light emitting signal line, and a data signal line, respectively. In an exemplary implementation, the timing controller may provide a grayscale value and a control signal suitable for a specification of the data driver to the data driver, may provide a clock signal, a scan start signal, etc. suitable for a specification of the scan driver to the scan driver, and may provide a clock signal, an emission stop signal, etc. suitable for a specification of the light emitting driver to the light emitting driver. The data driver may generate data voltages to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a pixel row as a unit, wherein n may be a natural number. The scan driver may generate a scan signal to be provided to the scan signal lines S1, S2, S3, . . . , and Sm by receiving the clock signal and the scan start signal from the timing controller. For example, the scan driver may sequentially provide the scan signal with an on-level pulse to the scan signal lines S1 to Sm. For example, the scan driver may be constructed in a form of a shift register and generate the scan signal in a manner of sequentially transmitting a scan start signal provided in a form of an on-level pulse to a next-stage circuit under control of the clock signal, wherein m may be a natural number. The light emitting driver may receive the clock signal, the emission stop signal, etc., from the timing controller to generate an emission signal to be provided to the light emitting signal lines E1, E2, E3, . . . , and Eo. For example, the light emitting driver may sequentially provide the emission signal with an off-level pulse to the light emitting signal lines E1 to Eo. For example, the light emitting driver may be constructed in a form of a shift register and generate the emission signal in a manner of sequentially transmitting the emission stop signal provided in a form of an off-level pulse to a next-stage circuit under control of the clock signal, wherein o may be a natural number.

Figure 2:
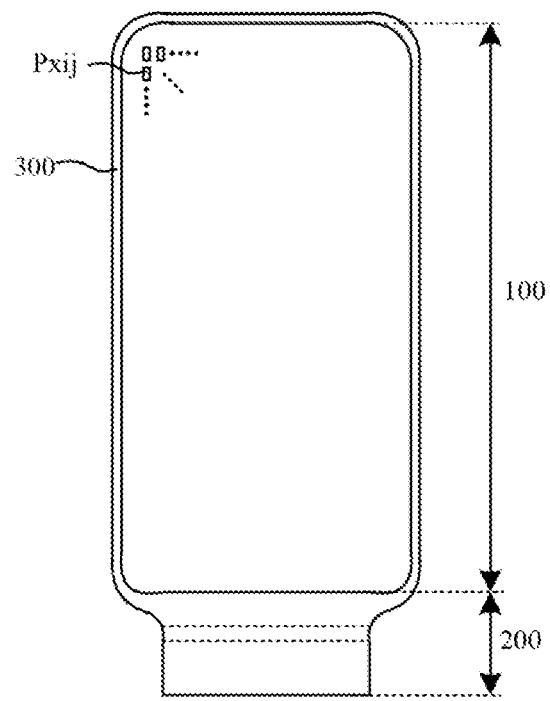
FIG. 2 is a schematic diagram of a structure of a display substrate.

FIG. 2 is a schematic diagram of a structure of a display substrate. As shown in FIG. 2, the display substrate may include a display area 100, a bonding area 200 located on a side of the display area 100, and a bezel area 300 located on another side of the display area 100. In an exemplary implementation, the display area 100 may be a plat area, including multiple sub-pixels Pxij that constitute a pixel array, wherein the multiple sub-pixels Pxij are configured to display a dynamic picture or a static image, and the display area 100 may be referred to as an Active Area (AA). In an exemplary implementation, the display substrate may be a flexible substrate, so that the display substrate may be deformable, for example, curled, bent, folded, or rolled.

In an exemplary implementation, the bezel area 300 may include a circuit region, a power supply line region, and a crack dam region, and a cutting region which are sequentially provided along a direction away from the display area 100. The circuit region is connected to the display area 100 and may at least include multiple cascaded gate drive circuits, and the gate drive circuits are connected to multiple scan lines of pixel drive circuits in the display area 100. The power supply line region is connected to the circuit region and may at least include a low-level power supply line. The low-level power supply line extends along a direction parallel to an edge of the display area and is connected to a cathode in the display area 100. The crack dam region is connected to the power supply line region and may at least include multiple cracks arranged on the composite insulation layer. The cutting region is connected to the crack dam region and may at least include a cutting groove provided on the composite insulation layer, wherein the cutting groove is configured for respectively cutting along the cutting groove by a cutting equipment after all film layers of the display substrate are manufactured.

In an exemplary implementation, the bonding area and the bezel area 300 may further be provided with a first isolation dam and a second isolation dam, both the first isolation dam and the second isolation dam may extend in a direction parallel to an edge of the display area to form a ring structure surrounding the display area 100. The edge of the display area is an edge of the display area close to the bonding area or the bezel area.

Figure 3:
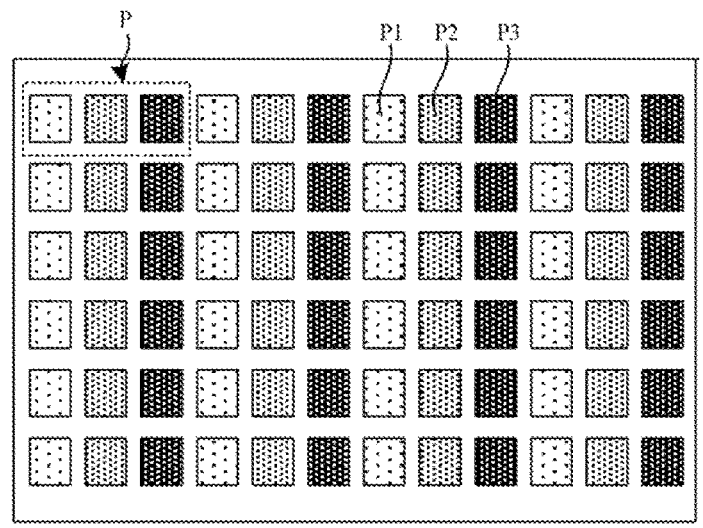
FIG. 3 is a schematic diagram of a planar structure of a display area in a display substrate.

FIG. 3 is a schematic diagram of a planar structure of a display area in a display substrate. As shown in FIG. 3, the display region may include multiple pixel units P arranged in an array. At least one pixel unit P may include a sub-pixel P1 emitting light of a first color, a second sub-pixel P2 emitting light of a second color, and a third sub-pixel P3 emitting light of a third color. Each sub-pixel may include a circuit unit and a light emitting unit. The circuit unit may at least include a pixel drive circuit which is connected to a scan signal line, a data signal line, and a light emitting signal line respectively. The pixel drive circuit is configured to receive a data voltage transmitted by the data signal line and output a corresponding current to a light emitting device under control of the scan signal line and the light emitting signal line. Each sub-pixel may include a light emitting unit, and the light emitting unit may at least include a light emitting device. The light emitting device is connected to a pixel drive circuit of a sub-pixel where the light emitting device is located, and the light emitting device is configured to emit light with a corresponding brightness in response to a current output by the pixel drive circuit of the sub-pixel where the light emitting device is located.

In an exemplary implementation, the first sub-pixel P1 may be a green (G) sub-pixel emitting green light, the second sub-pixel P2 may be a blue (B) sub-pixel emitting blue light, and the third sub-pixel P3 may be a red (R) sub-pixel emitting red light. In an exemplary implementation, a sub-pixel may be in a shape of a rectangle, a rhombus, a pentagon, or a hexagon. Three sub-pixels may be arranged in a manner to stand side by side horizontally, in a manner to stand side by side vertically, or in a delta-shaped arrangement, etc., which is not limited here in the present disclosure.

In an exemplary implementation, a pixel unit may include four sub-pixels, and the four sub-pixels may be arranged in a manner to stand side by side horizontally, in a manner to stand side by side vertically, or in a manner to form a square, which is not limited here in the present disclosure.

Figure 4:
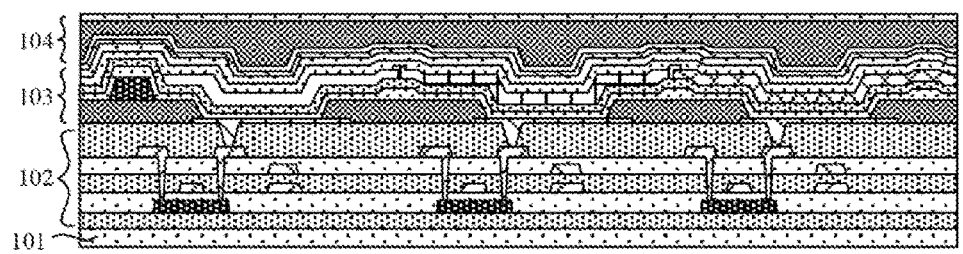
FIG. 4 is a schematic diagram of a sectional structure of a display area in a display substrate.

FIG. 4 is a schematic diagram of a sectional structure of a display area in a display substrate, illustrating a structure of three sub-pixels in the display area. As shown in FIG. 4, on a plane perpendicular to the display substrate, the display area may include a drive circuit layer 102 provided on a base substrate 101, a light emitting structure layer 103 provided on a side of the drive circuit layer 102 away from the base substrate 101, and an encapsulation structure layer 104 provided on a side of the light emitting structure layer 103 away from the base substrate 101. In some possible implementations, the display substrate may include another film layer, such as a touch structure layer, which is not limited here in the present disclosure.

In an exemplary implementation, the base substrate 101 may be a flexible base substrate, or may be a rigid base substrate. The drive circuit layer 102 may include multiple circuit units, the circuit units may at least include a pixel drive circuit, and the pixel drive circuit may include multiple transistors and a storage capacitor. In FIG. 4, only one pixel drive circuit including one transistor and one storage capacitor is taken as an example. The light emitting structure layer 103 may include multiple light emitting units, a light emitting unit may at least include a light emitting device, and the light emitting device may include an anode, an organic emitting layer, and a cathode. The anode is connected to a pixel drive circuit. The organic emitting layer is connected to the anode. The cathode is connected to the organic emitting layer. The organic emitting layer emits light of a corresponding color under driving of the anode and the cathode. The encapsulation layer 104 may include a first encapsulation layer, a second encapsulation layer, and a third encapsulation layer that are stacked. The first encapsulation layer and the third encapsulation layer may be made of an inorganic material, the second encapsulation layer may be made of an organic material, and the second encapsulation layer is arranged between the first encapsulation layer and the third encapsulation layer to form a laminated structure of an inorganic material/an organic material/an inorganic material and ensure that external moisture cannot enter the light emitting structure layer 103.

In an exemplary implementation, the organic emitting layer may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation, one or more layers of hole injection layers, hole transport layers, electron block layers, hole block layers, electron transport layers, and electron injection layers of all light emitting units may be respectively connected together to be a common layer. Emitting layers of adjacent sub-pixels may be overlapped slightly, or may be isolated from each other.

Figure 5:
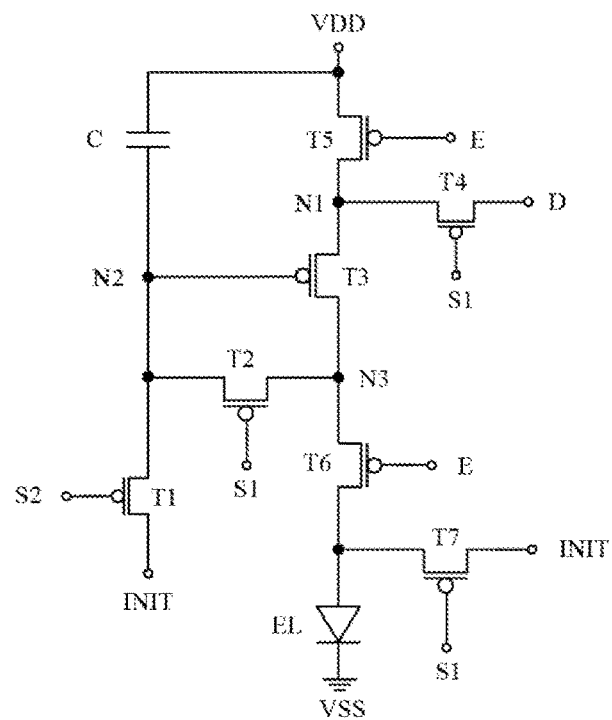
FIG. 5 is an equivalent circuit diagram of a pixel drive circuit.

FIG. 5 is an equivalent circuit diagram of a pixel drive circuit. In an exemplary implementation, the pixel drive circuit may have a structure of 3T1C, 4T1C, 5T1C, 5T2C, 6T1C, 7T1C, or 8T1C. As shown in FIG. 5, the pixel drive circuit may include seven transistors (a first transistor T1 to a seventh transistor T7), and one storage capacitor C. The pixel drive circuit is respectively connected to seven signal lines (a data signal line D, a first scan signal line S1, a second scan signal line S2, a light emitting signal line E, a first power supply line VDD, an initial signal line INIT and a second power supply line VSS).

In an exemplary implementation, the pixel drive circuit may include a first node N1, a second node N2, and a third node N3. Herein, the first node N1 is respectively connected to a first electrode of the third transistor T3, a second electrode of the fourth transistor T4, and a second electrode of the fifth transistor T5. The second node N2 is respectively connected to a second electrode of the first transistor, a first electrode of the second transistor T2, a gate electrode of the third transistor T3, and a first end of the storage capacitor C. The third node N3 is respectively connected to a second electrode of the second transistor T2, a second electrode of the third transistor T3, and a first electrode of the sixth transistor T6.

In an exemplary implementation, the first end of the storage capacitor C is connected to the second node N2, and a second end of the storage capacitor C is connected to the first power supply line VDD.

In an exemplary implementation, a gate electrode of the first transistor T1 is connected to the second scan signal line S2, a first electrode of the first transistor T1 is connected to the initial signal line INIT, and the second electrode of the first transistor is connected to the second node N2. When a scan signal with an on level is applied to the second scan signal line S2, the first transistor T1 transmits a first initialization voltage to the gate electrode of the third transistor T3 so as to initialize a charge amount of the gate electrode of the third transistor T3.

In an exemplary implementation, a gate electrode of the second transistor T2 is connected to the first scan signal line S1, the first electrode of the second transistor T2 is connected to the second node N2, and the second electrode of the second transistor T2 is connected to the third node N3. When a scan signal with an on level is applied to the first scan signal line S1, the second transistor T2 enables the gate electrode of the third transistor T3 to be connected to the second electrode of the third transistor T3.

The gate electrode of the third transistor T3 is connected to the second node N2, namely the gate electrode of the third transistor T3 is connected to the first end of the storage capacitor C, the first electrode of the third transistor T3 is connected to the first node N1, and the second electrode of the third transistor T3 is connected to the third node N3. The third transistor T3 may be referred to as a drive transistor, and the third transistor T3 determines a magnitude of a drive current flowing between the first power supply line VDD and the second power supply line VSS according to a potential difference between the gate electrode and the first electrode of the third transistor T3.

A gate electrode of the fourth transistor T4 is connected to the first scan signal line S1, a first electrode of the fourth transistor T4 is connected to the data signal line D, and the second electrode of the fourth transistor T4 is connected to the first node N1. The fourth transistor T4, may be referred to as a switch transistor, a scan transistor, etc., and the fourth transistor T4 enables a data voltage of the data signal line D to be input into the pixel drive circuit when a scan signal with an on level is applied to the first scan signal line S1.

A gate electrode of the fifth transistor T5 is connected to the light emitting signal line E, a first electrode of the fifth transistor T5 is connected to the first power supply line VDD, and the second electrode of the fifth transistor T5 is connected to the first node N1. A gate electrode of the sixth transistor T6 is connected to the light emitting signal line E, the first electrode of the sixth transistor T6 is connected to the third node N3, and a second electrode of the sixth transistor T6 is connected to a first electrode of a light emitting device. The fifth transistor T5 and the sixth transistor T6 may be referred to as light emitting transistors. When a light emitting signal with an on level is applied to the light emitting signal line E, the fifth transistor T5 and the sixth transistor T6 enable the light emitting device to emit light by forming a drive current path between the first power supply line VDD and the second power supply line VSS.

A gate electrode of the seventh transistor T7 is connected to the first scan signal line S1, a first electrode of the seventh transistor T7 is connected to the initial signal line INIT, and a second electrode of the seventh transistor T7 is connected to the first electrode of the light emitting device. When a scan signal with an on-level is applied to the first scan signal line S1, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary implementation, the light emitting device EL may be an OLED including a first electrode (anode), an organic emitting layer, and a second electrode (cathode) which are stacked, or may be a QLED including a first electrode (anode), a quantum dot light emitting layer, and a second electrode (cathode) which are stacked.

In an exemplary implementation, a second electrode of the light emitting device EL is connected to the second power supply line VSS, a signal of the second power supply line VSS is a low-level signal continuously provided, and a signal of the first power supply line VDD is a high-level signal continuously provided.

In an exemplary implementation, the first transistor T1 to the seventh transistor T7 may be P-type transistors, or may be N-type transistors. Use of a same type of transistors in a pixel drive circuit may simplify a process flow, reduce a process difficulty of a display panel, and improve a product yield. In some possible implementations, the first transistor T1 to the seventh transistor T7 may include a P-type transistor and an N-type transistor.

In an exemplary implementation, for the first transistor T1 to the seventh transistor T7, low temperature poly-silicon thin film transistors may be used, or oxide thin film transistors may be used, or both a low temperature poly-silicon thin film transistor and an oxide thin film transistor may be used. An active layer of a low temperature poly-silicon thin film transistor may be made of Low Temperature Poly-Silicon (LTPS for short), and an active layer of an oxide thin film transistor may be made of an oxide semiconductor (Oxide). Low temperature poly-silicon thin film transistors have advantages such as high migration rate and fast charging, and oxide thin film transistors have advantages such as low leakage current. The low temperature poly-silicon thin film transistors and the oxide thin film transistors are integrated on one display substrate to form a low temperature polycrystalline oxide (LTPO) display substrate, so that the advantages of both the low temperature poly-silicon thin film transistors and the oxide thin film transistors can be utilized, low-frequency drive can be achieved, power consumption can be decreased, and display quality can be improved.

In an exemplary implementation, taking a case that the seven transistors in the pixel drive circuit shown in FIG. 5 are all P-type transistors as an example, a working process of the pixel drive circuit may include following stages.

In a first stage t1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to the second node N2 to initialize the storage capacitor C to clear an original data voltage in the storage capacitor. The signals of the first scan signal line S1 and the light emitting signal line E are the high-level signals, so that the second transistor T2, the fourth transistor T4, the fifth transistor T5, the sixth transistor T6, and the seventh transistor T7 are turned off. An OLED does not emit light in this stage.

In a second stage t2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the first end of the storage capacitor C is at a low-level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization and ensuring that the OLED does not emit light. A signal of the second scan signal line S2 is a high-level signal, so that the first transistor T1 is turned off. A signal of the light emitting signal line E is a high-level signal, so that the fifth transistor T5 and the sixth transistor T6 are turned off.

In a third stage t3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between the gate electrode and the first electrode of the third transistor T3. Since the voltage of the second node N2 is Vd−|Vth|, the drive current of the third transistor T3 is as follows.

$$I = K^*(Vgs-Vth)^2 = K^*[(Vdd-Vd+|Vth|)-Vth]^2 = K^*[(Vdd-Vd)]^2$$

where I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

Figure 6:
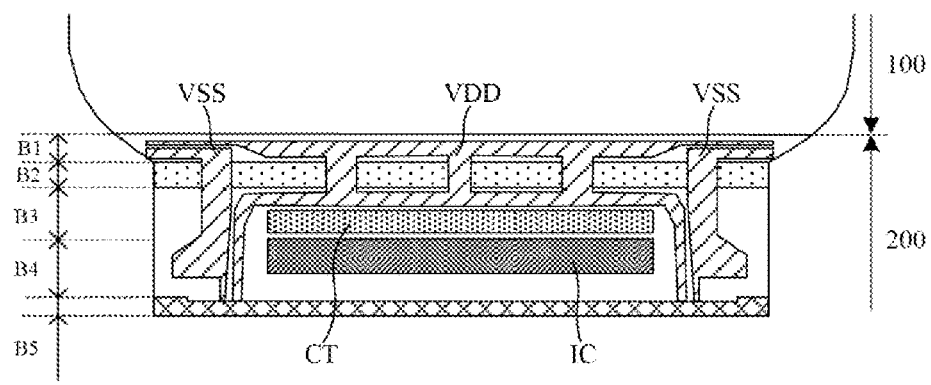
FIG. 6 is a schematic diagram of a planar structure of a bonding area in a display substrate.

FIG. 6 is a schematic diagram of a planar structure of a bonding area in a display substrate. As shown in FIG. 6, in an exemplary implementation, in a plane parallel to the display substrate, the bonding area 200 may be on a side of a display area 100, and the bonding area 200 may include a fan-out region B1, a bending region B2, a cell test region B3, a drive chip region B4, and a bonding pin region B5 that are provided sequentially along a direction away from the display area 100. The fan-out region B1 is connected to the display area 100 and may at least include a first power supply line VDD, and a second power supply line VSS and multiple data transmission lines. The multiple data transmission lines are configured to be connected to data signal lines of the display area 100 in a fanout wiring manner. The first power supply line VDD is configured to be connected to a high-level power supply line of the display area 100, and the second power supply line VSS is configured to be connected to a low-level power supply line of a bezel area. The bending region B2 is connected to the fan-out region B1 and may include a composite insulation layer provided with a groove, and the groove is configured to bend the bonding area 200 to a back of the display area 100. The cell test region B3 is connected to the bending region B2, and at least a Cell Test circuit (CT) for testing the display substrate may be provided. The cell test circuit (CT) can be connected to a corresponding signal line in the display area, and a light-on test and an aging procedure of the display substrate can be achieved. The drive chip region B4 is connected to the cell test region B3, and may be provided with at least an Integrated Circuit (IC for short). The drive chip is connected to a data signal line of the display area through a data transmission line in the fan-out area B1, the drive chip is configured to generate a drive signal required for driving a sub-pixel, and to supply the drive signal to the data signal line of the display area. For example, the drive signal may be a data signal that drives light emitting brightness of the sub-pixel. The bonding pin region B5 is connected to the drive chip region B4, and may be provided with at least multiple pins (PIN). The multiple pins are configured to be bonded and connected to an external Flexible Printed Circuit (FPC). In an exemplary implementation, the bonding area may include other circuits and signal lines such as an anti-static circuit, a multiplexing circuit (MUX) or the like, which are not limited here in the present disclosure.

In an exemplary implementation, a manufacturing process of a display substrate requires multiple tests, an important test of which is a Cell Test (CT) for light-on, also referred to as CT light-on test. The CT light-on test means that before the display substrate is bonded to a drive chip (IC) and a flexible circuit board (FPC) for inputting a display signal, a test signal is input to the display substrate to make its pixels present color, and a defect test device checks whether each pixel is in good condition to confirm whether the display substrate has defects. Since there are situations, such as interface not stable, in a completed light emitting device, another important process for the display substrate is an aging procedure. The aging procedure is a necessary process before the display apparatus is shipped. By lighting-on the light emitting device with a certain current for a period of time, an unstable interface can be aged off, a brightness attenuation of the light emitting device can be reduced, and a service life of the light emitting device can be prolonged.

Figure 7:
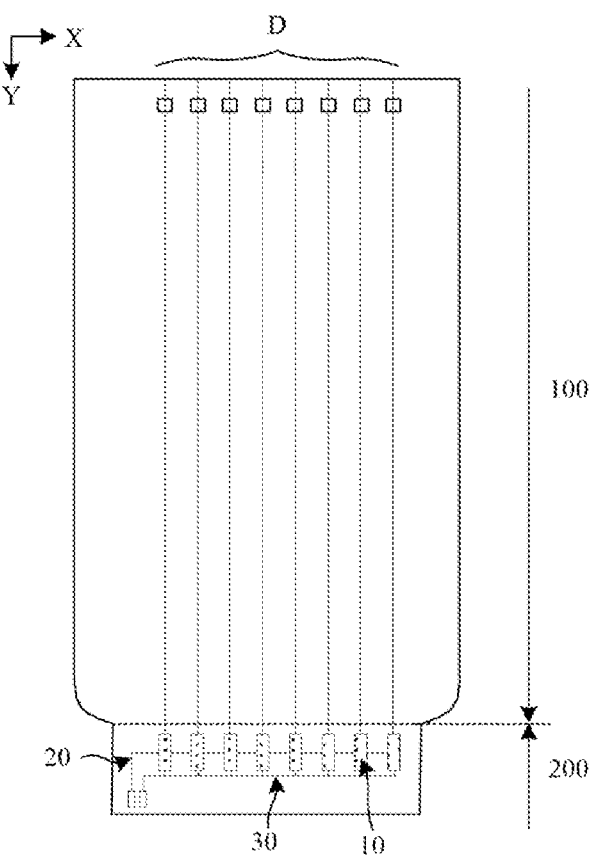
FIG. 7 is a schematic diagram showing cell test and an aging procedure of a display substrate.

FIG. 7 is a schematic diagram showing a cell test and an aging procedure of a display substrate. As shown in FIG. 7, the display substrate may include a display area 100 and a bonding area 200 located on a side of the display area 100. The display area 100 may include multiple sub-pixels constituting multiple pixel rows and multiple pixel columns and multiple data signal lines D, wherein each sub-pixel may include at least a pixel drive circuit and a light emitting device. The multiple data signal lines D may extend along a second direction Y and are provided sequentially at set intervals along a first direction X. Each of the data signal lines D is electrically connected to pixel drive circuits of multiple sub-pixels of one pixel column, the second direction Y and the first direction X intersect with each other. In an exemplary implementation, the second direction Y may be a pixel column direction, the first direction X may be a pixel row direction, and the second direction Y and the first direction X may be perpendicular to each other.

In an exemplary implementation, the bonding area 200 may include a cell test circuit, the cell test circuit may at least include multiple test units 10, a control line 20 and a test line 30. The multiple test units 10 may be provided sequentially at set intervals along the first direction X and positions of the multiple test units 10 may be in one-to-one correspondence with positions of the multiple data signal lines D in the display area 100. Each of the test units 10 may include a control terminal, an input terminal and an output terminal, one end of the control line 20 is connected correspondingly to a test pin of a bonding pin region, and the other end of the control line 20 may be connected correspondingly to the control terminals of the multiple test units 10, and the control line 20 is configured to control on or off of the multiple test units 10. One end of the test line 30 is connected correspondingly to the test pin of the bonding pin region, the other end of the test line 30 may be connected correspondingly to the input terminals of multiple test units 10, and the output terminals of the multiple test units 10 may be connected correspondingly to multiple data signal lines D of the display area 100. The test units 10 are configured to output a signal output from the test line 30 to the data signal lines D of the display area 100 under the control of the control line 20, so that an aging procedure and a light-on test of the display substrate is achieved.

In an exemplary implementation, a process of a light-on test and an aging treatment of the cell test circuit is as follows: before the display substrate is bonded to the drive chip and the flexible printed circuit, an external test device is connected to a test pin in the bonding area, wherein the external test device outputs a control signal and an test signal to the cell test circuit through the test pin, the control signal controls multiple test units to be turned on, and the multiple test units output the test signal to multiple data signal lines in the display area and perform a light-on test and an aging procedure for red sub-pixels, blue sub-pixels and green sub-pixels respectively.

Figure 8:
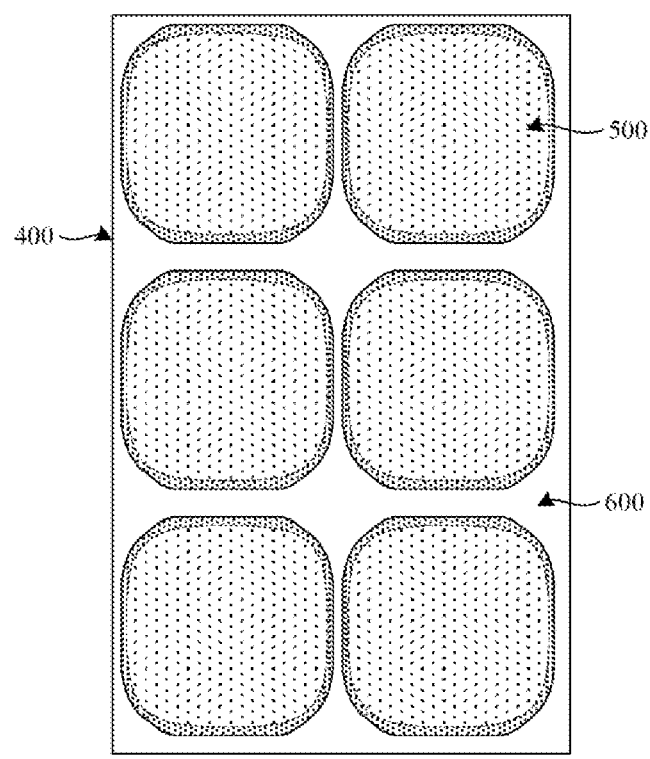
FIG. 8 is a schematic diagram showing an arrangement of multiple display substrates on a display motherboard.

At present, an OLED display apparatus is manufactured by firstly manufacturing a display motherboard and then cutting the display motherboard, so that the display motherboard is divided into multiple display substrates, and each of the separated display substrates can be used for forming a single OLED display apparatus. FIG. 8 is a schematic diagram showing an arrangement of multiple display substrates on a display motherboard. As shown in FIG. 8, the multiple display substrates 500 on the display motherboard 400 are arranged in a regular manner. Each of the display substrates 500 may at least include a display area and a bonding area, and a cutting area 600 is located outside of the display substrates 500. Cutting paths are provided in the cutting area 600 and after all film layers of the display motherboard are manufactured, a cutting equipment cuts along the cutting paths respectively to form multiple display substrates 500. At present, an existing OLED display apparatus employs a single substrate (Cell) light-on mode. After cutting and forming multiple display substrates, a CT light-on test and an aging procedure are carried out on each display substrate, and tested good products are sent to a next process.

An exemplary embodiment of the present disclosure provides a display motherboard, including at least one substrate area, the substrate area includes at least one test pad region, at least one test wire region and at least two display substrates. Each display substrate includes a display area and a bonding area located on a side of the display area. The display area includes multiple sub-pixels, the bonding area at least includes a cell test circuit and multiple test pins. The cell test circuit is connected to the multiple test pins and the multiple sub-pixels. The test pad region includes multiple pads, and the test wire region includes multiple signal wires. First ends of the multiple signal wires are connected correspondingly to the multiple pads, second ends of the multiple signal wires extend to the bonding area of the display substrate in the substrate area and are connected correspondingly to the multiple test pins of the display substrate. The multiple pads are configured to enable an external test device to provide test signals to the cell test circuit of each display substrate in the substrate area through the multiple pads, and perform a light-on test or an aging procedure on each display substrate in the substrate area simultaneously.

An exemplary embodiment of the present disclosure provides a display motherboard, which can realize a Group CT light-on mode, thus efficiencies of CT light-on test and aging procedure are effectively improved, process time is reduced, and production capacity is effectively improved.

Figure 9:
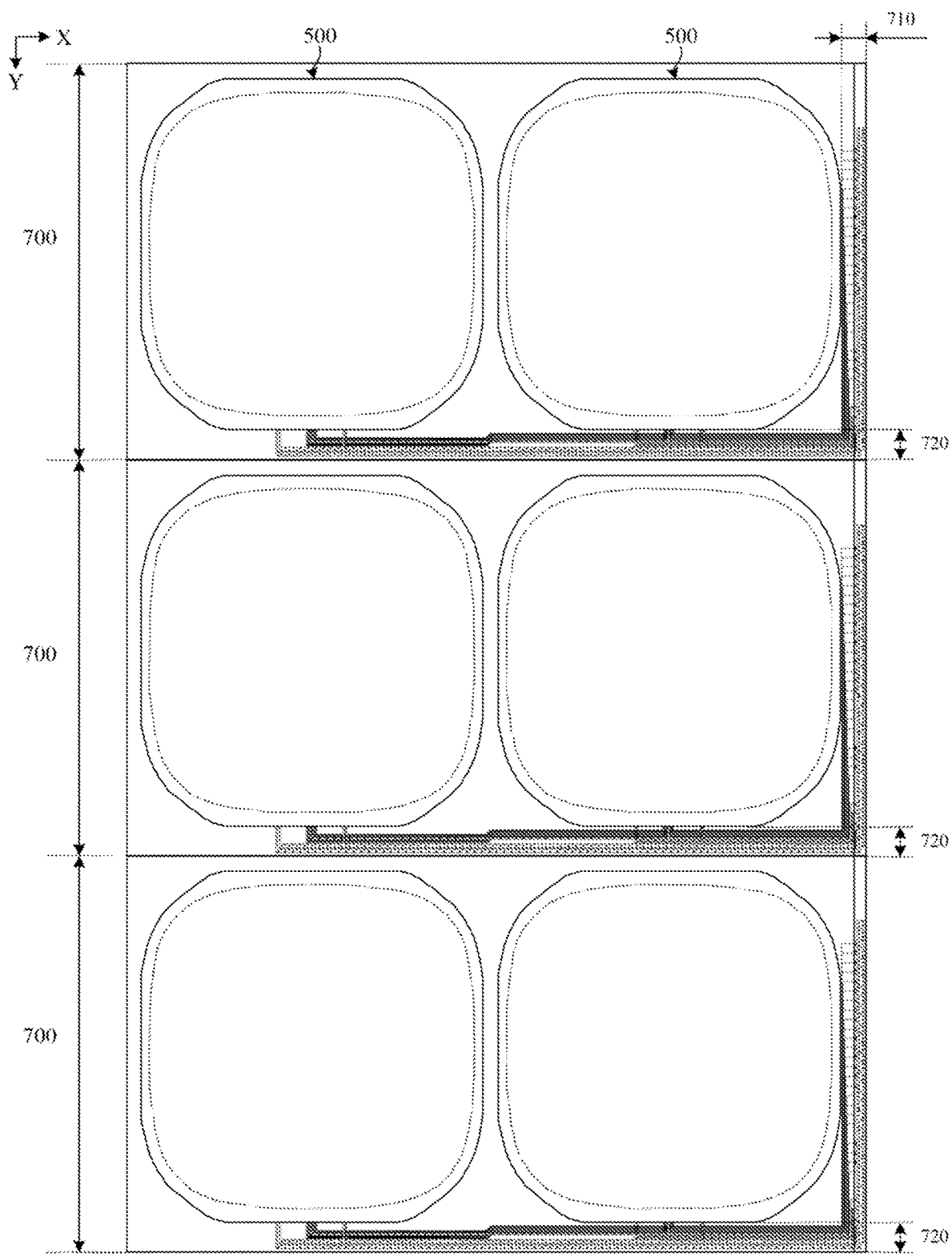
FIG. 9 is a schematic diagram of a structure of a display motherboard according to an exemplary embodiment of the present disclosure.

FIG. 9 is a schematic diagram of a structure of a display motherboard according to an exemplary embodiment of the present disclosure, illustrating a planar structure in which the display motherboard includes three substrate areas and each substrate area includes two display substrates. As shown in FIG. 9, the display motherboard may include three substrate areas 700 sequentially provided along the second direction Y, and each substrate area 700 may include two display substrates 500 sequentially provided along the first direction X, and the first direction X intersects with the second direction Y.

In an exemplary implementation, at least one substrate area 700 may further include at least one test pad region 710 and at least one test wire region 720. In the at least one substrate area 700, the test pad region 710 may be at an edge of the at least one substrate area 700 in the first direction X, or may be at an edge of the at least one substrate area 700 in a direction opposite to the first direction X and the test wire region 720 may be at an edge of the at least one substrate area 700 in the second direction Y, or may be at an edge of the at least one substrate area 700 in a direction opposite to the second direction Y.

In an exemplary implementation, the display substrate 500 may at least include a display area and a bonding area. The display area may at least include multiple sub-pixels arranged in an array, and the bonding area may be provided on a side of the display area in the second direction Y. The bonding area may at least include a cell test region and a bonding pin region. The cell test region may be provided with a cell test circuit (CT), and the bonding pin region may be provided with multiple test pins. The cell test circuit CT may be connected correspondingly to multiple test pins of the bonding pin region and multiple sub-pixels in the display area through multiple signal lines, and the cell test circuit CT is configured to perform a light-on test and an aging procedure on the display substrate where the cell test circuit CT is located.

In an exemplary implementation, a test pad region 710 may at least include multiple pads sequentially provided along the second direction Y and each pad may have a rectangular shape. The multiple pads are configured to be connected to an external test device, so that the external test device provides test signals to each of the display substrates 500 in the substrate area 700 through the multiple pads.

In an exemplary implementation, a test wire region 720 may at least include multiple signal wires. First ends of the multiple signal wires are connected correspondingly to the multiple pads of the test pad region 710 respectively, and second ends of the multiple signal wires extend to a bonding area of each of the display substrates 500 in the substrate area 700 and are connected correspondingly to multiple test pins of each of the display substrates 500 respectively, so that the external test device provides test signals to the cell test circuit CT of each display substrate 500 in the substrate area 700 through the multiple pads and the multiple signal wires.

In an exemplary implementation, the display motherboard may include m substrate areas 700 sequentially provided along the second direction Y, and each substrate area 700 may include n display substrates 500 sequentially provided along the first direction X to form an n (V)*m(H) arrangement, where m may be a positive integer greater than or equal to 1 and n may be a positive integer greater than or equal to 2. For example, the display motherboard may be in a 2 (V)*4 (H) arrangement, including 4 substrate areas and each substrate area including 2 display substrates. For another example, the display motherboard may be in a 3 (V)*4 (H) arrangement, including 4 substrate areas and each substrate area including 3 display substrates. For another example, the display motherboard may be in a 3 (V)*3 (H) arrangement, including 3 substrate areas and each substrate area including 3 display substrates. For another example, the display motherboard may be in a 2 (V)*5 (H) or 2 (V)*3 (H) arrangement, or in another arrangement, which is not limited here in the present disclosure.

In some possible exemplary implementations, each substrate area 700 may include two test pad regions 710. For a case where the substrate area 700 includes one test pad region 710, the test pad region 710 may be provided at an edge of the substrate area 700 in the first direction X, or may be provided at an edge of the substrate area 700 in a direction opposite to the first direction X. For a case where the substrate area 700 includes two test pad regions 710, the two test pad regions 710 may be provided at two edges of the substrate area 700 in the first direction X respectively.

In some possible exemplary implementations, each substrate area 700 may include two test wire regions 720. For a case where the substrate area 700 includes one test wire region 720, the test wire region 720 may be provided at an edge of the substrate area 700 in the second direction Y, or may be provided at an edge of the substrate area 700 in a direction opposite to the second direction Y. For a case where the substrate area 700 includes two test wire regions 720, the two test wire regions 720 may be provided at two edges of the substrate area 700 in the second direction Y respectively.

Figure 10:
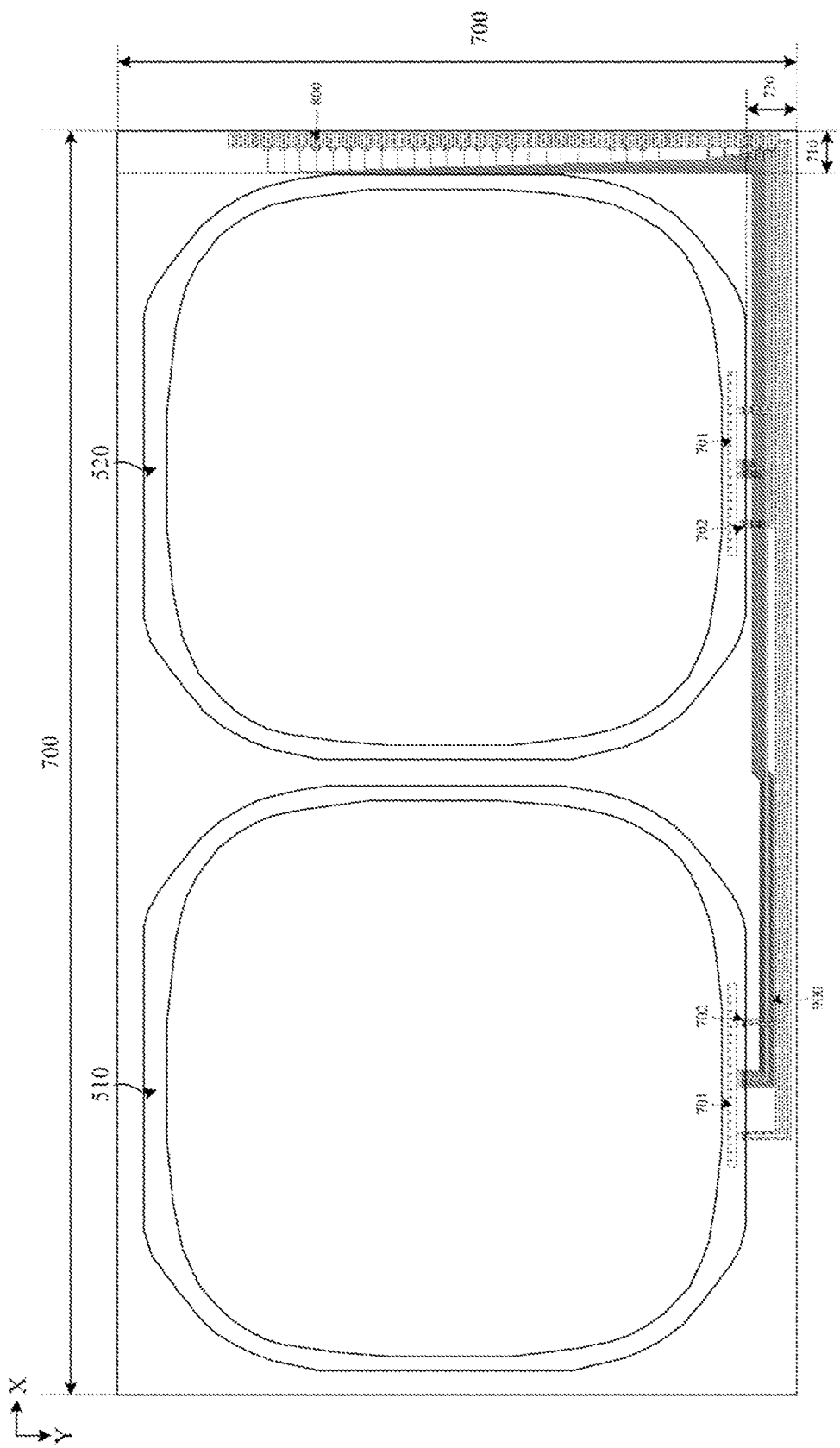
FIG. 10 is a schematic diagram of a structure of a substrate area according to an exemplary embodiment of the present disclosure.

FIG. 10 is a schematic diagram of a structure of a substrate area according to an exemplary embodiment of the present disclosure, illustrating a planar structure of a substrate area in the display motherboard as shown in FIG. 9. As shown in FIG. 10, the substrate area 700 may at least include a first display substrate 510, a second display substrate 520, a test pad region 710, and a test wire region 720. The first display substrate 510 and the second display substrate 520 may be provided sequentially along the first direction X, the test pad region 710 may be on a side of the second display substrate 520 away from the first display substrate 510 (an edge of the substrate area 700 in the first direction X), and the test wire region 720 may be on a side of the first display substrate 510 and the second display substrate 520 in the second direction Y.

In some possible exemplary implementations, the test pad region 710 may be on a side of the first display substrate 510 away from the second display substrate 520 and the test wire region 720 may be on a side of the first display substrate 510 and the second display substrate 520 in a direction opposite to the second direction Y.

In an exemplary implementation, the test pad region 710 may at least include multiple pads 800 sequentially provided along the second direction Y, and the test wire region 720 may at least include multiple signal wires 900. First ends of the multiple signal wires 900 are connected correspondingly to the multiple pads 800 respectively, and second ends of the multiple signal wires 900 are connected correspondingly to multiple test pins of the bonding area in the first display substrate 510 and multiple test pins of the bonding area in the second display substrate 520 respectively after extending toward the first display substrate 510 and the second display substrate 520.

In an exemplary implementation, signals required for an ET light-on test and an aging procedure for each display substrate may at least include a test signal (CT signal), a gate drive signal (GOA signal), a multiplexing selection signal (MUX signal), and a DC power supply signal.

In an exemplary implementation, the test signal (CT signal) may include at least one or more of the following: a test switch signal SW, a red sub-pixel test signal DR_L of the first display substrate, a green sub-pixel test signal DG_L of the first display substrate, a blue sub-pixel test signal DB_L of the first display substrate, a red sub-pixel test signal DR_R of the second display substrate, a green sub-pixel test signal DG_R of the second display substrate, and a blue sub-pixel test signal DB_R of the second display substrate.

In an exemplary implementation, a test switch signal wire of the first display substrate and a test switch signal wire of the second display substrate may be connected together, that is, the first display substrate and the second display substrate may share one test switch signal wire for transmitting the test switch signal SW to save test signal channels.

In an exemplary implementation, test signals of sub-pixels of a same color in the first display substrate and the second display substrate employ separate signal wires to control and adjust voltage values of the test signals, respectively. The present disclosure provides test signals to sub-pixels of a same color in the two display substrates by employing separate signal wires, which can control and adjust light-on brightness and color coordinates of the two display substrates respectively, avoid brightness difference and color coordinate difference caused by different lengths of signal wires of the two display substrates, and an aging procedure and a CT light-on test of the two display substrates under a same gray scale and same brightness is achieved.

In an exemplary implementation, the gate drive signal (GOA signal) may at least include any one or more of the following: a scan start signal GSTV, a scan first clock signal GCK, a scan second clock signal GCB, a light emitting start signal ESTV, a light emitting first clock signal ECK, and a light emitting second clock signal ECB. In an exemplary implementation, multiple gate drive signal wires of the first display substrate and multiple gate drive signal wires of the second display substrate may be connected together in one-to-one correspondence, that is, the first display substrate and the second display substrate may share the gate drive signal wires that transmits gate drive signals to save test signal channels.

In an exemplary implementation, the multiplexing selection signal (MUX signal) may at least include any one or more of the following: a first selection signal MUX1, a second selection signal MUX2, a third selection signal MUX3, a fourth selection signal MUX4, a fifth selection signal MUX5, and a sixth selection signal MUX6. In an exemplary implementation, multiple selection signal wires of the first display substrate and multiple selection signal wires of the second display substrate may be connected together in one-to-one correspondence, that is, the first display substrate and the second display substrate may share the selection signal wires that transmits multiplexing selection signals to save test signal channels.

In an exemplary implementation, the DC power supply signal may at least include any one or more of the following: a high-level signal VGH, a low-level signal VGL, a first initial signal VINIT1_L of the first display substrate, a second initial signal VINIT2_L of the first display substrate, a first initial signal VINIT1_R of the second display substrate, a second initial signal VINIT2_R of the second display substrate, a first power supply signal VDD_L of the first display substrate, a second power supply signal VSS_L of the first display substrate, a first power supply signal VDD_R of the second display substrate, and a second power supply signal VSS_R of the second display substrate.

In an exemplary implementation, the first initial signals VINIT1, the second initial signals VINIT2, the first power supply signals VDD, and the second power supply signals VSS in the first display substrate and the second display substrate employ separate power supply wires to control and adjust voltage drops of the power supply signals, respectively. In the present disclosure, power supply signals are provided to two display substrates respectively by employing separate power supply wires, which can eliminate resistance difference caused by different lengths of power supply wires of the two display substrates by a resistance compensation, so that resistances of the power supply wires of the two display substrates are as close as possible, thus ensuring that power supply voltages of the two display substrates are close, a situation that one group of voltages is small and the other group of voltages exceed an output capacity of equipment can be effectively avoided, and an aging procedure and an ET light-on test of the two display substrates under a same power supply voltage can be achieved.

In an exemplary implementation, a high-level signal line of the first display substrate and a high-level signal line of the second display substrate may be connected together and a low-level signal line of the first display substrate and a low-level signal line of the second display substrate may be connected together, i.e., the first display substrate and the second display substrate may share a high-level signal line that transmits a high-level signal and the first display substrate and the second display substrate may share a low-level signal line that transmits a low-level signal to save test signal channels.

Figure 11:
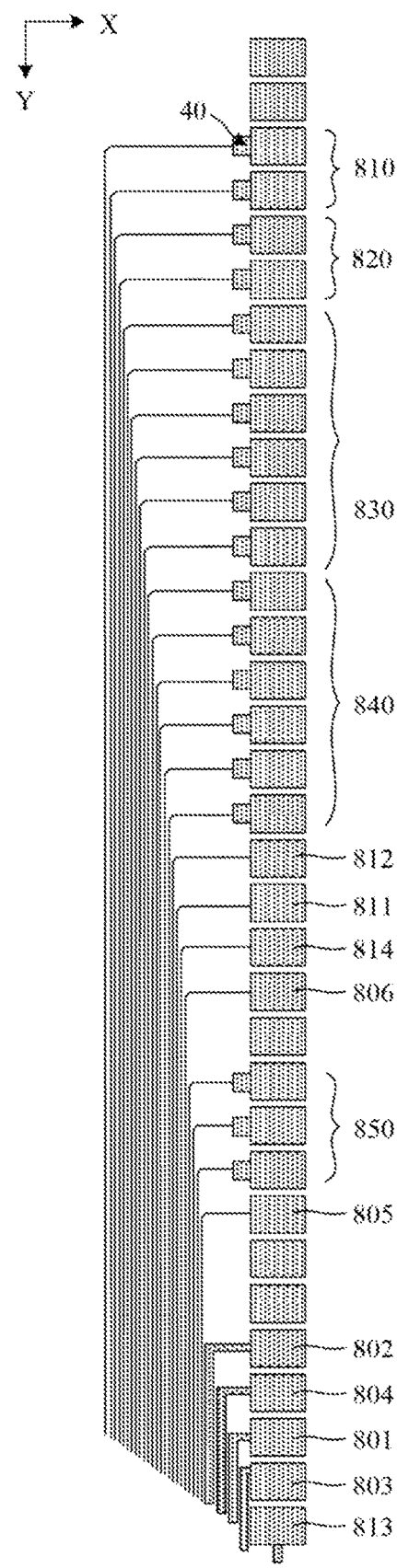
FIG. 11 is a schematic diagram of a structure of a test pad region according to an exemplary embodiment of the present disclosure.

FIG. 11 is a schematic diagram of a structure of a test pad region according to an exemplary embodiment of the present disclosure, illustrating a planar structure of a test pad region in the substrate area as shown in FIG. 10. As shown in FIG. 11, the test pad region may at least include multiple pads and the multiple pads may be provided sequentially along the second direction Y.

In an exemplary implementation, the multiple pads of the test pad region may at least include a first pad group 810, a second pad group 820, a third pad group 830, a fourth pad group 840, a fifth pad group 850, and multiple power supply pads.

In an exemplary implementation, multiple pads in the first pad group 810 are configured to provide a red sub-pixel test signal DR_R, a green sub-pixel test signal DG_R, and a blue sub-pixel test signal DB_R to the second display substrate respectively. Multiple pads in the second pad group 820 are configured to provide a red sub-pixel test signal DR_L, a green sub-pixel test signal DG_L, and a blue sub-pixel test signal DB_L to the first display substrate respectively. Multiple pads in the third pad group 830 are configured to provide a first selection signal MUX1, a second selection signal MUX2, a third selection signal MUX3, a fourth selection signal MUX4, a fifth selection signal MUX5, and a sixth selection signal MUX6 to the first display substrate and the second display substrate respectively. Multiple pads in the fourth pad group 840 are configured to provide a scan start signal GSTV, a scan first clock signal GCK, a scan second clock signal GCB, a light emitting start signal ESTV, a light emitting first clock signal ECK, and a light emitting second clock signal ECB to the first display substrate and the second display substrate respectively. Multiple pads in the fifth pad group 850 are configured to provide a test switch signal SW to the first display substrate and the second display substrate respectively.

In an exemplary implementation, the multiple power supply pads may at least include a first pad 801, a second pad 802, a third pad 803, a fourth pad 804, a fifth pad 805, a sixth pad 806, an eleventh pad 811, a twelfth pad 812, a thirteenth pad 813, and a fourteenth pad 814.

In an exemplary implementation, the first pad 801 is configured to provide a first power supply signal VDD_L to the first display substrate, the second pad 802 is configured to provide a first power supply signal VDD_R to the second display substrate, the third pad 803 is configured to provide a second power supply signal VSS_L to the first display substrate, the fourth pad 804 is configured to provide a second power supply signal VSS_R to the second display substrate, the fifth pad 805 is configured to provide a high-level signal VGH to the first display substrate and the second display substrate respectively, the sixth pad 806 is configured to provide a low-level signal VGL to the first display substrate and the second display substrate respectively, the eleventh pad 811 is configured to provide a first initial signal VINIT1_L to the first display substrate, the twelfth pad 812 is configured to provide a first initial signal VINIT1_R to the second display substrate, the thirteenth pad 813 is configured to provide a second initial signal VINIT2_L to the first display substrate, and the fourteenth pad 814 is configured to provide a second initial signal VINIT2_R to the second display substrate.

In an exemplary implementation, the first pad group 810, the second pad group 820, the third pad group 830, and the fourth pad group 840 may be provided sequentially along the second direction Y, the twelfth pad 812 may be provided on a side of the fourth pad group 840 in the second direction Y, the eleventh pad 811 may be provided on a side of the twelfth pad 812 in the second direction Y, the fourteenth pad 814 may be provided on a side of the eleventh pad 811 in the second direction Y, the sixth pad 806 may be provided on a side of the fourteenth pad 814 in the second direction Y, the fifth pad group 850 may be provided on a side of the sixth pad 806 in the second direction Y, the fifth pad 805 may be provided on a side of the fifth pad group 850 in the second direction Y, the second pad 802 may be provided on a side of the fifth pad 805 in the second direction Y, the fourth pad 804 may be provided on a side of the second pad 802 in the second direction Y, the first pad 801 may be provided on a side of the fourth pad 804 in the second direction Y, the third pad 803 may be provided on a side of the first pad 801 in the second direction Y, and the thirteenth pad 813 may be provided on a side of the third pad 803 in the second direction Y.

In an exemplary implementation, at least one dummy pad may be provided between part of adjacent pads, which is not limited here in the present disclosure.

Figure 12:
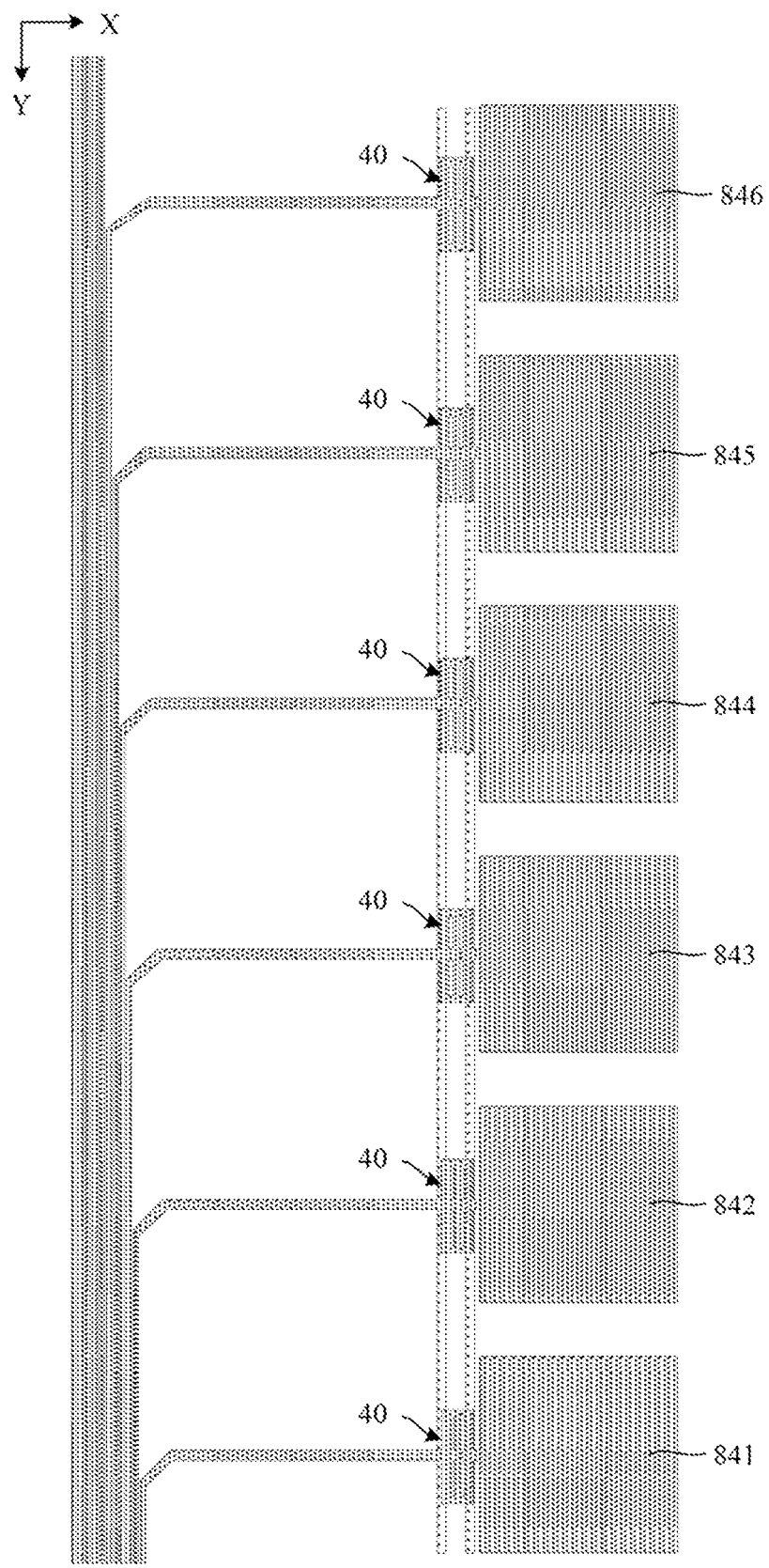
FIG. 12 is a schematic diagram of a structure of a fourth pad group according to an exemplary embodiment of the present disclosure.

FIG. 12 is a schematic diagram of a structure of a fourth pad group according to an exemplary embodiment of the present disclosure, illustrating a planar structure of a fourth pad group in the test pad region as shown in FIG. 11. As shown in FIG. 12, the fourth pad group may at least include a forty-first pad 841 providing a scan start signal GSTV to the first display substrate and the second display substrate respectively, a forty-second pad 842 providing a light emitting start signal ESTV to the first display substrate and the second display substrate respectively, a forty-third pad 843 providing a light emitting second clock signal ECB to the first display substrate and the second display substrate respectively, a forty-fourth pad 844 providing a light emitting first clock signal ECK to the first display substrate and the second display substrate respectively, a forty-fifth pad 845 providing a scan second clock signal GCB to the first display substrate and the second display substrate respectively, and a forty-sixth pad 846 providing a scan first clock signal GCK to the first display substrate and the second display substrate respectively.

As shown in FIG. 11 and FIG. 12, the test pad region may further include multiple electrostatic discharge (ESD) units 40, the multiple electrostatic discharge units 40 provided on a side of the multiple pads close to the second display substrate respectively, and the electrostatic discharge (ESD) units 40 are configured to prevent introduction of static electricity.

In an exemplary implementation, the pads providing CT signals, GOA signals, and MUX signals need to be provided with electrostatic discharge units 40, so multiple pads in the first pad group 810, the second pad group 820, the third pad group 830, the fourth pad group 840, and the fifth pad group 850 are each provided with an electrostatic discharge unit 40. First ends of the multiple electrostatic discharge units 40 are connected correspondingly to the multiple pads in the first pad group 810, the second pad group 820, the third pad group 830, the fourth pad group 840, and the fifth pad group 850, and second ends of the multiple electrostatic discharge units 40 are connected correspondingly to first ends of the multiple signal wires. In an exemplary implementation, the first pad 801 to the sixth pad 806 and the eleventh pad 811 to the fourteenth pad 814 providing DC power supply signals are not provided with an electrostatic discharge unit 40.

In an exemplary implementation, the electrostatic discharge unit 40 may have a thin film transistor structure, multiple thin film transistor structures are connected to at least one electrostatic discharge line, so that static electricity conducted to the at least one electrostatic discharge line is discharged directly through a ground pad to a ground terminal.

In an exemplary implementation, in an existing display substrate employing a single substrate light-on mode, an external test device is connected to multiple test pins in the bonding pin region to achieve signal input, and in order to prevent introduction of static electricity, corresponding electrostatic discharge units are usually provided at positions corresponding to the multiple test pins. According to a research from the inventor of the present application, during a reliability process of the display substrate, multiple electrostatic discharge units are corroded, which leads to a risk of a connection failure between a test pin and a signal line in the bonding area of the display substrate. By employing a Group CT light-on mode, the electrostatic discharge units are provided in the test pad region of the display motherboard, so that multiple test pins of the display substrate do not need to be provided with an electrostatic discharge unit, thus a problem of a connection failure between a test pin and a signal line in the bonding area caused by corrosion of an electrostatic discharge unit can be effectively avoided and a yield is effectively improved.

In an exemplary implementation, after a Group CT is completed, the electrostatic discharge units provided in the test pad region are cut off, which is not limited here in the present disclosure.

Figure 13:
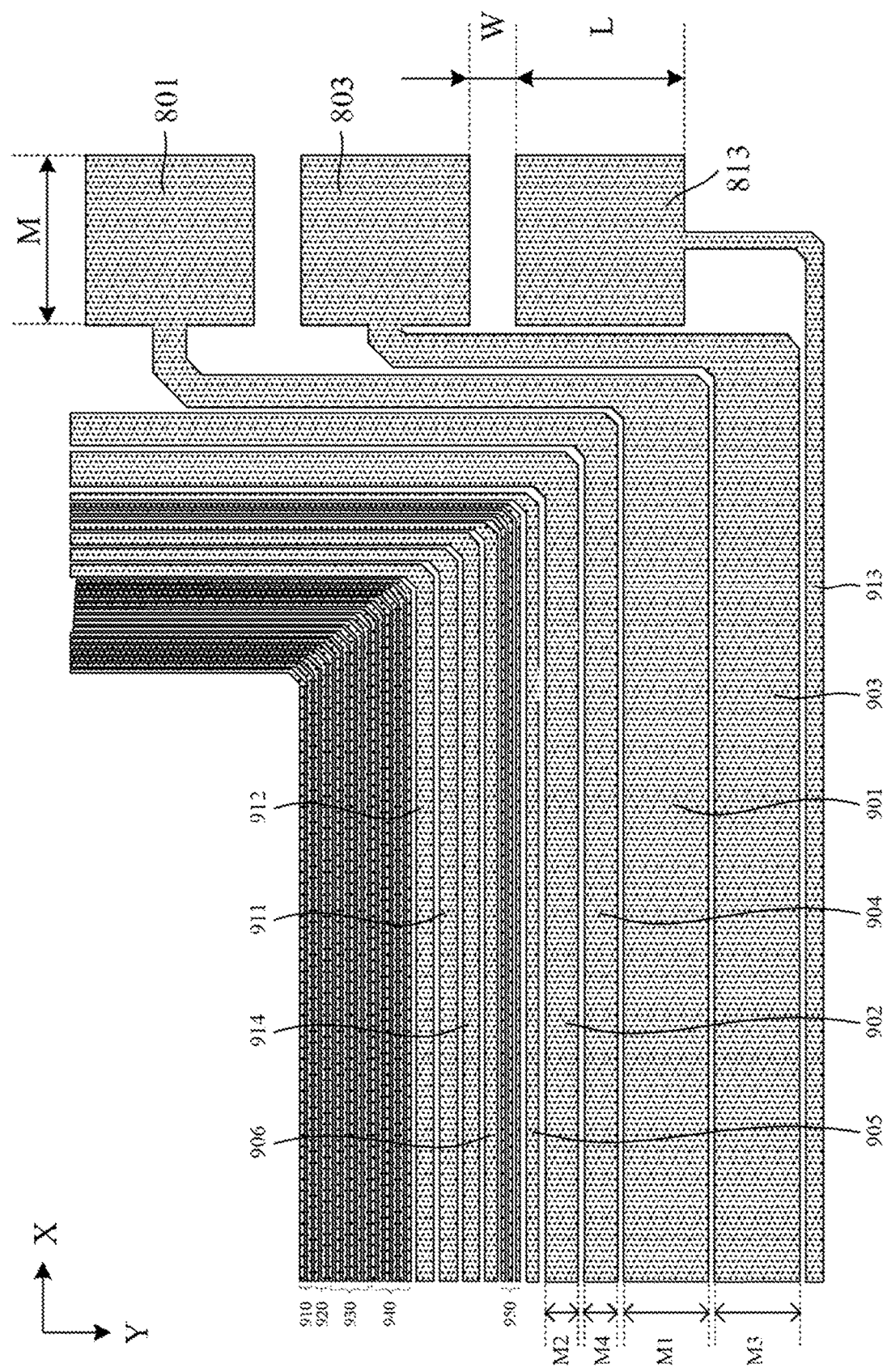
FIG. 13 is a schematic diagram of a structure of a junction area between a test pad region and a test wire region according to an embodiment of the present disclosure.

FIG. 13 is a schematic diagram of a structure of a junction area between a test pad region and a test wire region according to an embodiment of the present disclosure. As shown in FIG. 13, in an exemplary implementation, since the first pad 801, the third pad 803, and the thirteenth pad 813 are all pads that supply a DC power supply signal to the first display substrate, they are provided at an end of the test pad region in the second direction Y, so that a power supply wire that supplies a DC power supply signal to the first display substrate is located outside a test wire region to simplify wire layout.

In an exemplary implementation, a shape of a pad of the test pad region may be a rectangular shape and shapes and dimensions of multiple pads may be substantially the same. A length L of the pad may be about 300 µm to 1200 µm, a width M of the pad may be about 80 µm to 1200 µm, and a spacing W between adjacent pads may be about 150 µm to 1500 µm. The length L and the spacing W may be average dimensions along an arrangement direction of the multiple pads and the width M may be an average dimension perpendicular to the arrangement direction of the multiple pads.

In an exemplary implementation, the pads may include a probe-type pad and a crimping-type pad, the probe-type pad is configured to be connected to a probe, and the crimping-type pad is configured to be connected to an FPC gold finger.

In an exemplary implementation, for a probe-type pad, a length L of the probe-type pad may be about 400 µm to 1200 µm, a width M of the probe-type pad may be about 400 µm to 1200 µm, and a spacing W between adjacent probe-type pads may be about 100 µm to 1500 µm. For example, the length L of the probe-type pad may be about 700 µm, the width M of the probe-type pad may be about 700 µm, and the spacing W between adjacent probe-type pads may be about 200 µm.

In an exemplary implementation, for a crimping-type pad, a length L of the crimping-type pad may be about 300 µm to 1000 µm, a width M of the crimping-type pad may be about 80 µm to 250 µm, and a spacing W between adjacent crimp-type pads may be about 50 µm to 300 µm. For example, the length L of the crimping-type pad may be about 440 µm, the width M of the crimping-type pad may be about 120 µm, and the spacing W between adjacent crimping-type pads may be about 80 µm.

In an exemplary implementation, multiple signal wires of the test wire region may at least include a first wire group 910, a second wire group 920, a third wire group 930, a fourth wire group 940, a fifth wire group 950, and multiple power supply wires that transmit DC power supply signals.

In an exemplary implementation, first ends of multiple signal wires in the first wire group 910 are connected correspondingly to multiple pads in the first pad group 810, second ends of the multiple signal wires in the first wire group 910 are connected correspondingly to multiple test pins of the second display substrate after extending to the second display substrate, and the multiple signal wires in the first wire group 910 are configured to provide a red sub-pixel test signal DR_R, a green sub-pixel test signal DG_R, and a blue sub-pixel test signal DB_R to the second display substrate respectively.

In an exemplary implementation, first ends of multiple signal wires in the second wire group 920 are connected correspondingly to multiple pads in the second pad group 820, second ends of the multiple signal wires in the second wire group 920 are connected correspondingly to multiple test pins of the first display substrate after extending to the first display substrate, and the multiple signal wires in the second wire group 920 are configured to provide a red sub-pixel test signal DR_L, a green sub-pixel test signal DG_L, and a blue sub-pixel test signal DB_L to the first display substrate respectively.

In an exemplary implementation, first ends of multiple signal wires in the third wire group 930 are connected correspondingly to multiple pads in the third pad group 830, second ends of the multiple signal wires in the third wire group 930 are connected correspondingly to multiple test pins of the first display substrate and the second display substrate respectively after extending to the first display substrate and the second display substrate, and the multiple signal wires in the third wire group 930 are configured to provide a first selection signal MUX1, a second selection signal MUX2, a third selection signal MUX3, a fourth selection signal MUX4, a fifth selection signal MUX5, and a sixth selection signal MUX6 to the first display substrate and the second display substrate respectively.

In an exemplary implementation, first ends of multiple signal wires in the fourth wire group 940 are correspondingly connected to multiple pads in the fourth pad group 840, second ends of the multiple signal wires in the fourth wire group 940 are connected correspondingly to multiple test pins of the first display substrate and the second display substrate respectively after extending to the first display substrate and the second display substrate, and the multiple signal wires in the fourth wire group 940 are configured to provide a scan start signal GSTV, a scan first clock signal GCK, a scan second clock signal GCB, a light emitting start signal ESTV, a light emitting first clock signal ECK, and a light emitting second clock signal ECB to the first display substrate and the second display substrate respectively.

In an exemplary implementation, first ends of multiple signal wires in the fifth wire group 950 are correspondingly connected to multiple pads in the fifth pad group 850, second ends of the multiple signal wires in the fifth wire group 950 are connected correspondingly to multiple test pins of the first display substrate and the second display substrate respectively after extending to the first display substrate and the second display substrate, and the multiple signal wires in the fifth wire group 950 are configured to provide test switch signals SW to the first display substrate and the second display substrate respectively. In an exemplary implementation, the fifth wire group 950 may include a first control line, a second control line, and a third control line.

In an exemplary implementation, the multiple power supply wires may at least include a first power supply wire 901, a second power supply wire 902, a third power supply wire 903, a fourth power supply wire 904, a fifth power supply wire 905, a sixth power supply wire 906, an eleventh power supply wire 911, a twelfth power supply wire 912, a thirteenth power supply wire 913, and a fourteenth power supply wire 914.

In an exemplary implementation, a first end of the first power supply wire 901 is connected to the first pad 801, a second end of the first power supply wire 901 is connected to a corresponding test pin of the first display substrate after extending to the first display substrate, and the first power supply wire 901 is configured to provide a first power supply signal VDD_L to the first display substrate. A first end of the second power supply wire 902 is connected to the second pad 802, a second end of the second power supply wire 902 is connected to a corresponding test pin of the second display substrate after extending to the second display substrate, and the second power supply wire 902 is configured to provide a first power supply signal VDD_R to the second display substrate. A first end of the third power supply wire 903 is connected to the third pad 803, a second end of the third power supply wire 903 is connected to a corresponding test pin of the first display substrate after extending to the first display substrate, and the third power supply wire 903 is configured to provide a second power supply signal VSS_L to the first display substrate. A first end of the fourth power supply wire 904 is connected to the fourth pad 804, a second end of the fourth power supply wire 904 is connected to a corresponding test pin of the second display substrate after extending to the second display substrate, and the fourth power supply wire 904 is configured to provide a second power supply signal VSS_R to the second display substrate. A first end of the fifth power supply wire 905 is connected to the fifth pad 805, a second end of the fifth power supply wire 905 is connected to corresponding test pins of the first display substrate and the second display substrate respectively after extending to the first display substrate and the second display substrate, and the fifth power supply wire 905 is configured to provide a high-level signal VGH to the first display substrate and the second display substrate. A first end of the sixth power supply wire 906 is connected to the sixth pad 806, a second end of the sixth power supply wire 906 is connected to corresponding test pins of the first display substrate and the second display substrate respectively after extending to the first display substrate and the second display substrate, and the sixth power supply wire 906 is configured to provide a low-level signal VGL to the first display substrate and the second display substrate.

In an exemplary implementation, a first end of the eleventh power supply wire 911 is connected to the eleventh pad 811, a second end of the eleventh power supply wire 911 is connected to a corresponding test pin of the first display substrate after extending to the first display substrate, and the eleventh power supply line 911 is configured to provide a first initial signal VINIT1_L to the first display substrate. A first end of the twelfth power supply wire 912 is connected to the twelfth pad 812, a second end of the twelfth power supply wire 912 is connected to a corresponding test pin of the second display substrate after extending to the second display substrate, and the twelfth power supply wire 912 is configured to provide a first initial signal VINIT1_R to the second display substrate. A first end of the thirteenth power supply wire 913 is connected to the thirteenth pad 813, a second end of the thirteenth power supply wire 913 is connected to a corresponding test pin of the first display substrate after extending to the first display substrate, and the thirteenth power supply wire 913 is configured to provide a second initial signal VINIT2_L to the first display substrate. A first end of a fourteenth power supply wire 914 is connected to the fourteenth pad 814, a second end of the fourteenth power supply wire 914 is connected to a corresponding test pin of the second display substrate after extending to the second display substrate, and the fourteenth power supply wire 914 is configured to provide a second initial signal VINIT2_R to the second display substrate.

In an exemplary implementation, the twelfth power supply wire 912, the eleventh power supply wire 911, the fourteenth power supply wire 914, the sixth power supply wire 906, the fifth power supply wire 905, the second power supply wire 902, the fourth power supply wire 904, the first power supply wire 901, the third power supply wire 903, and the thirteenth power supply wire 913 may be provided sequentially along the second direction Y, that is, the first power supply wire 901 and the third power supply wire 903 may be provided on a side of the second power supply wire 902 and the fourth power supply wire 904 in the second direction Y, and the fifth power supply wire 905 and the sixth power supply wire 906 may be provided on a side of the second power supply wire 902 in a direction opposite to the second direction Y. The eleventh power supply wire 911, the twelfth power supply wire 912, and the fourteenth power supply wire 914 may be provided on a side of the second power supply wire 902 in a direction opposite to the second direction Y, and the thirteenth power supply wire 913 may be provided on a side of the third power supply wire 903 in the second direction Y.

In an exemplary implementation, a first width M1 of the first power supply wire 901 may be greater than a second width M2 of the second power supply wire 902, and a third width M3 of the third power supply wire 903 may be greater than a fourth width M4 of the fourth power supply wire 904. Each of the first width M1, the second width M2, the third width M3, and the fourth width M4 is a smallest dimension of the wire extending along the first direction X in the second direction Y.

In an exemplary implementation, each of the first power supply wire 901 and the second power supply wire 902 transmits a first power supply signal, and each of the third power supply wire 903 and the fourth power supply wire 904 transmits a second power supply signal. However, since the first power supply wire 901 and the third power supply wire 903 are configured to transmit power supply signals to the first display substrate and the second power supply wire 902 and the fourth power supply wire 904 are configured to transmit power supply signals to the second display substrate, so that an extension length of the first power supply wire 901 is greater than an extension length of the second power supply wire 902, an extension length of the third power supply wire 903 is greater than an extension length of the fourth power supply wire 904, there is a difference in wire lengths between the first power supply wire 901 and the second power supply wire 902, and there is a difference in wire lengths between the third power supply wire 903 and the fourth power supply wire 904. In the present disclosure, resistance compensation can be achieved by adjusting widths of the power supply wires, so that a resistance of the first power supply wire 901 and a resistance of the second power supply wire 902 are as close as possible and a resistance of the third power supply wire 903 and a resistance of the fourth power supply wire 904 are as close as possible. During an aging procedure, in order to achieve a better aging effect, it is usually necessary to input a higher cross-voltage. Therefore, a resistor design, for example for a power supply line, is highly necessary. An equal resistance design can ensure that input voltages of all display substrates are close, and a situation that one group of voltages is small and the other group of voltages exceed an output capacity of equipment can be avoided.

In an exemplary implementation, a calculation formula for resistance is R=ρ L/S, where ρ is a resistivity of a wire, which is determined by a nature of a material itself, L is a length of the wire, and S is a cross-sectional area of the wire. According to the calculation formula for resistance, during design, cross-sectional areas of two power supply lines can be calculated when resistances are close, and corresponding widths of power supply lines can be obtained.

In an exemplary implementation, a width of the eleventh power supply wire 911 may be greater than a width of the twelfth power supply wire 912, and a resistance of the eleventh power supply wire 911 and a resistance of the twelfth power supply wire 912 are brought as close as possible by resistance compensation to ensure that input voltages input to all display substrates are close.

In an exemplary implementation, a width of the thirteenth power supply wire 913 may be greater than a width of the fourteenth power supply wire 914, and a resistance of the thirteenth power supply wire 913 and a resistance of the fourteenth power supply wire 914 are brought as close as possible by resistance compensation to ensure that input voltages input to all display substrates are close.

In an exemplary implementation, at least one signal wire in the test wire region may be in a single-layer wire structure, a double-layer wire structure, or a wire structure of more than three layers. For example, multiple power supply wires providing a DC power supply signal may be in a single-layer wire structure and the power supply wires may be provided in a first source-drain metal layer (SD1). As another example, the multiple power supply wires providing the DC power supply signal may be in a double-layer wire structure or a wire structure of more than three layers, and the multiple power supply wires may be provided in a first gate metal layer (GATE1) and a second gate metal layer (GATE2) respectively, or may be provided in the first gate metal layer and the first source-drain metal layer (SD1) respectively, or provided in the second gate metal layer and the first source-drain metal layer respectively, or provided in the first gate metal layer, the second gate metal layer, and the first source-drain metal layer respectively.

Figure 14:
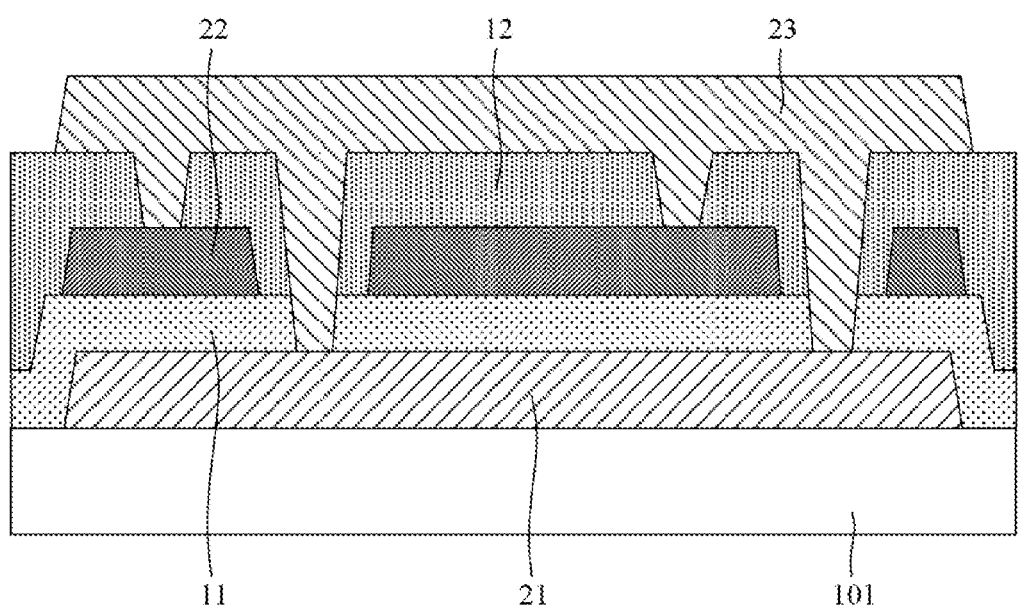
FIG. 14 is a schematic diagram of a triple-layer wire structure according to an exemplary embodiment of the present disclosure.

FIG. 14 is a schematic diagram of a triple-layer wire structure according to an exemplary embodiment of the present disclosure. As shown in FIG. 14, on a plane perpendicular to the display substrate, the display substrate may at least include a base substrate 101, a first gate metal layer 21 provided on the base substrate 101, a first insulation layer 11 provided on a side of the first gate metal layer 21 away from the base substrate, a second gate metal layer 22 provided on a side of the first insulation layer 11 away from the base substrate, a second insulation layer 12 provided on a side of the second gate metal layer 22 away from the base substrate, and a first source-drain metal layer 23 provided on a side of the second insulation layer 12 away from the base substrate. The first gate metal layer 21 may include a first sub-line, the second gate metal layer 22 may include a second sub-line, and the first source-drain metal layer 23 may include a third sub-line. On the one hand, the third sub-line is connected to the first sub-line through multiple first vias, and on the other hand, the third sub-line is connected to the second sub-line through multiple second vias, such that the first sub-line, the second sub-line, and the third sub-line are connected to each other, and the first sub-line, the second sub-line, and the third sub-line connected to each other constitute the triple-layer wire structure.

In an exemplary implementation, one or more of the first power supply wire 901, the second power supply wire 902, the third power supply wire 903, the fourth power supply wire 904, the fifth power supply wire 905, the sixth power supply wire 906, the eleventh power supply wire 911, the twelfth power supply wire 912, the thirteenth power supply wire 913, and the fourteenth power supply wire 914 may employ a double-layer wire structure or a wire structure of more than three layers, which is not limited here in the present disclosure.

Figure 15:
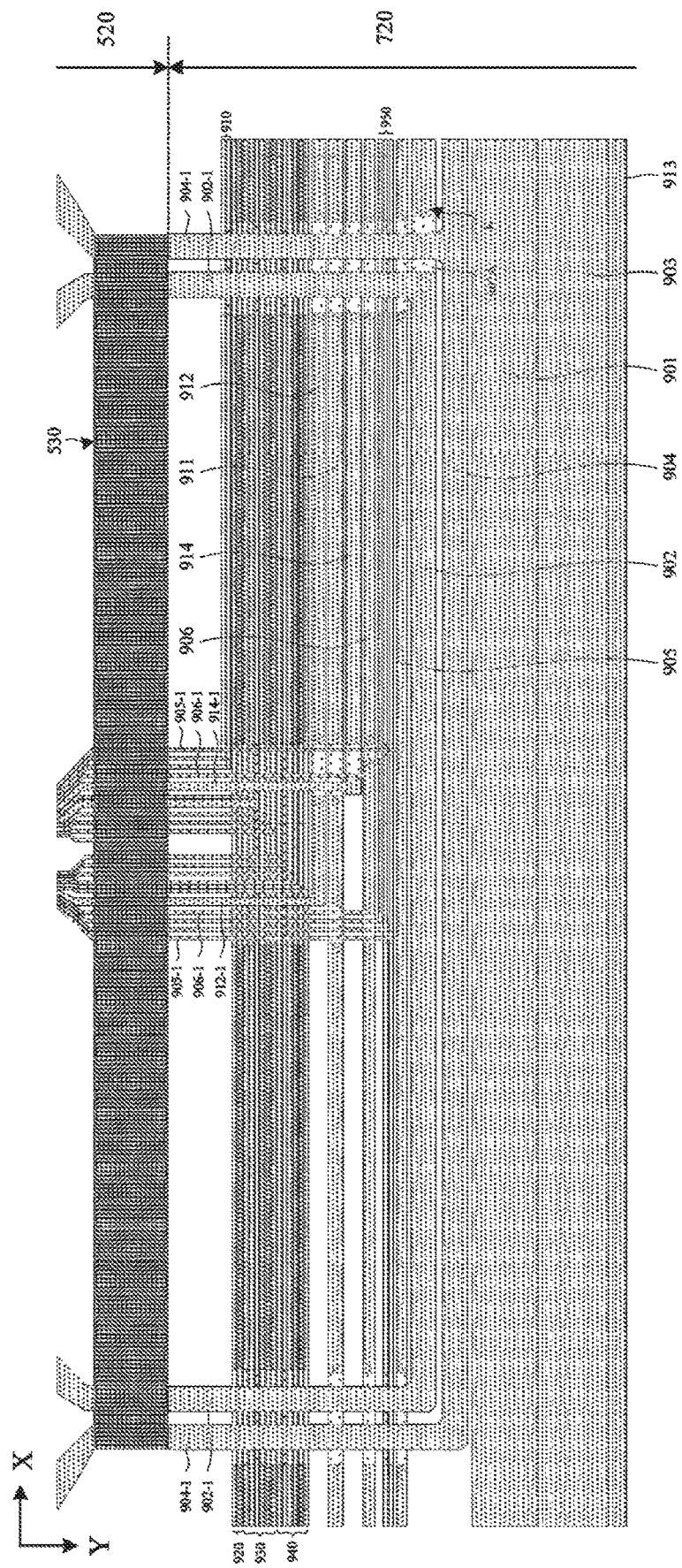
FIG. 15 is a schematic diagram of a structure of a test wire region according to an exemplary embodiment of the present disclosure.

FIG. 15 is a schematic diagram of a structure of a test wire region according to an exemplary embodiment of the present disclosure, which is a wire structure of an area of the test wire region corresponding to a second display substrate. As shown in FIG. 15, in an exemplary implementation, the test wire region 720 may be located on a side of the second display substrate 520 in the substrate area in the second direction Y and the test wire region 720 may include multiple wire groups and multiple power supply wires. The multiple wire groups may at least include a first wire group 910, a second wire group 920, a third wire group 930, a fourth wire group 940, and a fifth wire group 950, the multiple signal wires in the multiple wire groups extend along the first direction X, and the multiple power supply wires may at least include a first power supply wire 901, a second power supply wire 902, a third power supply wire 903, a fourth power supply wire 904, a fifth power supply wire 905, a sixth power supply wire 906, an eleventh power supply wire 911, a twelfth power supply wire 912, a thirteenth power supply wire 913, and a fourteenth power supply wire 914 extending along the first direction X respectively.

In an exemplary implementation, the first wire group 910, the second wire group 920, the third wire group 930, the fourth wire group 940, and the fifth wire group 950 may be provided sequentially in a direction away from the second display substrate 520. The second wire group 920 may be provided on a side of the first wire group 910 in the second direction Y. The third wire group 930 may be provided on a side of the second wire group 920 in the second direction Y. The fourth wire group 940 may be provided on a side of the third wire group 930 in the second direction Y, and the fifth wire group 950 may be provided between the fifth power supply wire 905 and the sixth power supply wire 906.

In an exemplary implementation, the twelfth power supply wire 912, the eleventh power supply wire 911, the fourteenth power supply wire 914, the sixth power supply wire 906, the fifth power supply wire 905, the second power supply wire 902, the fourth power supply wire 904, the first power supply wire 901, the third power supply wire 903, and the thirteenth power supply wire 913 may be provided sequentially in the direction away from the second display substrate 520 and the twelfth power supply wire 912 may be provided on a side of the fourth wire group 940 away from the second display substrate 520.

In an exemplary implementation, first ends of the second power supply wire 902, the fourth power supply wire 904, the twelfth power supply wire 912, and the fourteenth power supply wire 914 are connected to corresponding pads of the test pad region, and second ends of the second power supply wire 902, the fourth power supply wire 904, the twelfth power supply wire 912, and the fourteenth power supply wire 914 are connected to multiple test pins 530 of the second display substrate respectively after extending to a corresponding area of the second display substrate.

In an exemplary implementation, the fourth power supply wire 904 may be connected correspondingly to multiple test pins 530 of the second display substrate through at least two fourth connection lines 904-1. The at least two fourth connection lines 904-1 may be provided on two sides of the second display substrate in the first direction X respectively. First ends of two fourth connection lines 904-1 are connected to the fourth power supply wire 904 respectively, second ends of the two fourth connection lines 904-1 are connected to test pins 530 on two sides of the second display substrate 520 in the first direction X respectively after extending in a direction close to the second display substrate 520 (in a direction opposite to the second direction Y) to form a "U"-shaped connection structure.

In an exemplary implementation, the second power supply wire 902 may be connected correspondingly to multiple test pins 530 of the second display substrate through at least two second connection lines 902-1. The at least two second connection lines 902-1 may be provided on inner sides of the two fourth connection lines 904-1 respectively. First ends of two second connection lines 902-1 are connected to the second power supply wire 902 respectively, second ends of the two second connection lines 902-1 are connected to test pins 530 on two sides of the second display substrate 520 in the first direction X respectively after extending in the direction close to the second display substrate 520 to form a "U"-shaped connection structure. The "U"-shaped connection structure formed by the second power supply wire 902 and the two second connection lines 902-1 is nested within the "U"-shaped connection structure formed by the fourth power supply wire 904 and the two fourth connection lines 904-1.

In an exemplary implementation, the second power supply wire 902 and the fourth power supply wire 904 may each be in a shape of a line extending along the first direction X. The second connection lines 902-1 and the fourth connection lines 904-1 may each be in a shape of a line extending along the second direction Y. The second power supply wire 902 and the second connection lines 902-1 may be provided in a same layer and are interconnected to form an integral structure. The fourth power supply wire 904 and the fourth connection lines 904-1 may be provided in a same layer and are interconnected to form an integral structure.

In the exemplary implementation, since the second power supply wire 902 is on a side of the fourth power supply wire 904 close to the second display substrate 520, the second power supply wire 902 needs to employ a bridging structure to avoid the fourth connection lines 904-1. In an exemplary implementation, the second power supply wire 902 may include at least one lapping part 902A, the second power supply wire 902 may be provided in one conductive layer, the at least one lapping part 902A may be provided in another conductive layer, and two ends of the at least one lapping part 902A in the first direction X are connected to the second power supply wire 902 respectively through vias K to constitute a complete second power supply wire 902. For example, the at least one lapping part 902A may be provided in the second gate metal layer (GATE2) and the second power supply wire 902 may be provided in the first source-drain metal layer (SD1).

In an exemplary implementation, the twelfth power supply wire 912 may be connected correspondingly to a test pin 530 of the second display substrate through at least one twelfth connection line 912-1. The at least one twelfth connection line 912-1 may be provided in the middle of the second display substrate in the first direction X. A first end of each twelfth connection line 912-1 is connected to the twelfth power supply wire 912, and a second end of the twelfth connection line 912-1 is connected to a test pin 530 in the middle of the second display substrate 520 in the first direction X after extending in the direction close to the second display substrate 520.

In an exemplary implementation, the fourteenth power supply wire 914 may be connected correspondingly to a test pin 530 of the second display substrate through at least one fourteenth connection line 914-1. The at least one fourteenth connection line 914-1 may be provided in the middle of the second display substrate in the first direction X, a first end of each fourteenth connection line 914-1 is connected to the fourteenth power supply wire 914, and a second end of the fourteenth connection line 914-1 is connected to a test pin 530 in the middle of the second display substrate 520 in the first direction X after extending in the direction close to the second display substrate 520.

In an exemplary implementation, since the twelfth power supply wire 912 and the fourteenth power supply wire 914 are on a side of the second power supply wire 902 close to the second display substrate 520, the twelfth power supply wire 912 and the fourteenth power supply wire 914 need to employ a bridging structure to avoid the second connection lines 902-1, the fourth connection lines 904-1, and other connection lines. In an exemplary implementation, each of the twelfth power supply wire 912 and the fourteenth power supply wire 914 may include multiple lapping parts and the complete twelfth power supply wire 912 and fourteenth power supply wire 914 are formed through the lapping parts.

In an exemplary implementation, first ends of the fifth power supply wire 905 and the sixth power supply wire 906 are connected to corresponding pads of the test pad region, and second ends of the fifth power supply wire 905 and the sixth power supply wire 906 continue to extend to a corresponding area of the first display substrate after passing a corresponding area of the second display substrate. In a corresponding area of the second display substrate, the fifth power supply wire 905 and the sixth power supply wire 906 are connected respectively to test pins 530 of the second display substrate.

In an exemplary implementation, the fifth power supply wire 905 may be connected to test pins 530 of the second display substrate through at least two fifth connection lines 905-1 respectively to form a "U"-shaped connection structure. The sixth power supply wire 906 may be connected to test pins 530 of the second display substrate through at least two sixth connection lines 906-1 respectively and a "U"-shaped connection structure formed by the sixth power supply wire 906 and two sixth connection lines 906-1 is nested within the "U"-shaped connection structure formed by the fifth power supply wire 905 and two fifth connection lines 905-1.

In an exemplary implementation, since the fifth power supply wire 905 and the sixth power supply wire 906 are on the side of the second power supply wire 902 close to the second display substrate 520, and the sixth power supply wire 906 is on a side of the fifth power supply wire 905 close to the second display substrate 520, the fifth power supply wire 905 need to employ a bridging structure to avoid the second connection lines 902-1 and the fourth connection lines 904-1, and the sixth power supply wire 906 need to employ a bridging structure to avoid the second connection lines 902-1, the fourth connection lines 904-1, and the fifth connection lines 905-1. In an exemplary implementation, each of the fifth power supply wire 905 and the sixth power supply wire 906 may include multiple lapping parts and the complete fifth power supply wire 905 and sixth power supply wire 906 are formed through the lapping parts.

In an exemplary implementation, first ends of the first power supply wire 901, the third power supply wire 903, the eleventh power supply wire 911, and the thirteenth power supply wire 913 are connected to corresponding pads of the test pad region, and second ends thereof continue to extend to a corresponding area of the first display substrate after passing a corresponding area of the second display substrate, and are not connected to test pins of the second display substrate.

In an exemplary implementation, since the eleventh power supply wire 911 is on a side of the fourteenth power supply wire 914 close to the second display substrate 520, the eleventh power supply wire 911 needs to employ a bridging structure to avoid corresponding second connection lines 902-1, fourth connection lines 904-1, fifth connection lines 905-1, sixth connection lines 906-1 and fourteenth connection lines 914-1. The eleventh power supply wire 911 may at least include multiple lapping parts, and the complete eleventh power supply wire 911 is formed through the lapping parts.

In an exemplary implementation, the first wire group 910 may at least include two signal wires extending along the first direction X. First ends of the two signal wires are correspondingly connected to two pads of the first pad group in the test pad region, second ends of the two signal wires may be correspondingly connected to test pins 530 of the second display substrate through connection lines. one of the signal wires is configured to provide a test signal to multiple sub-pixels of red pixel column and blue pixel column in the second display substrate, and the other signal wire is configured to provide a test signal to multiple sub-pixels of a green pixel column in the second display substrate, i.e. a red sub-pixel test signal DR_R and a blue sub-pixel test signal DB_R in the second display substrate employ one signal wire, and a green sub-pixel test signal DG_R in the second display substrate employs another signal wire. In an exemplary implementation, two signal wires in the first wire group 910 employ a bridging structure to avoid corresponding connection lines.

In an exemplary implementation, the second wire group 920 may at least include two signal wires extending along the first direction X. First ends of the two signal wires are correspondingly connected to two pads of the second pad group in the test pad region, second ends of the two signal wires continue to extend to a corresponding area of the first display substrate after passing a corresponding area of the second display substrate, and are not connected to test pins of the second display substrate.

In an exemplary implementation, the third wire group 930, the fourth wire group 940, and the fifth wire group 950 may each include multiple signal wires extending along the first direction X. First ends of the multiple signal wires are correspondingly connected to multiple pads of the third pad group, the fourth pad group, and the fifth pad group in the test pad region, and second ends of the multiple signal wires continue to extend to a corresponding area of the first display substrate after passing a corresponding area of the second display substrate. In a corresponding area of the second display substrate, multiple signal wires are connected respectively to test pins 530 of the second display substrate through connection lines. In an exemplary implementation, multiple signal wires in the third wire group 930, the fourth wire group 940, and the fifth wire group 950 need to employ a bridging structure to avoid corresponding connection lines, which will not be repeated herein.

Figure 16:
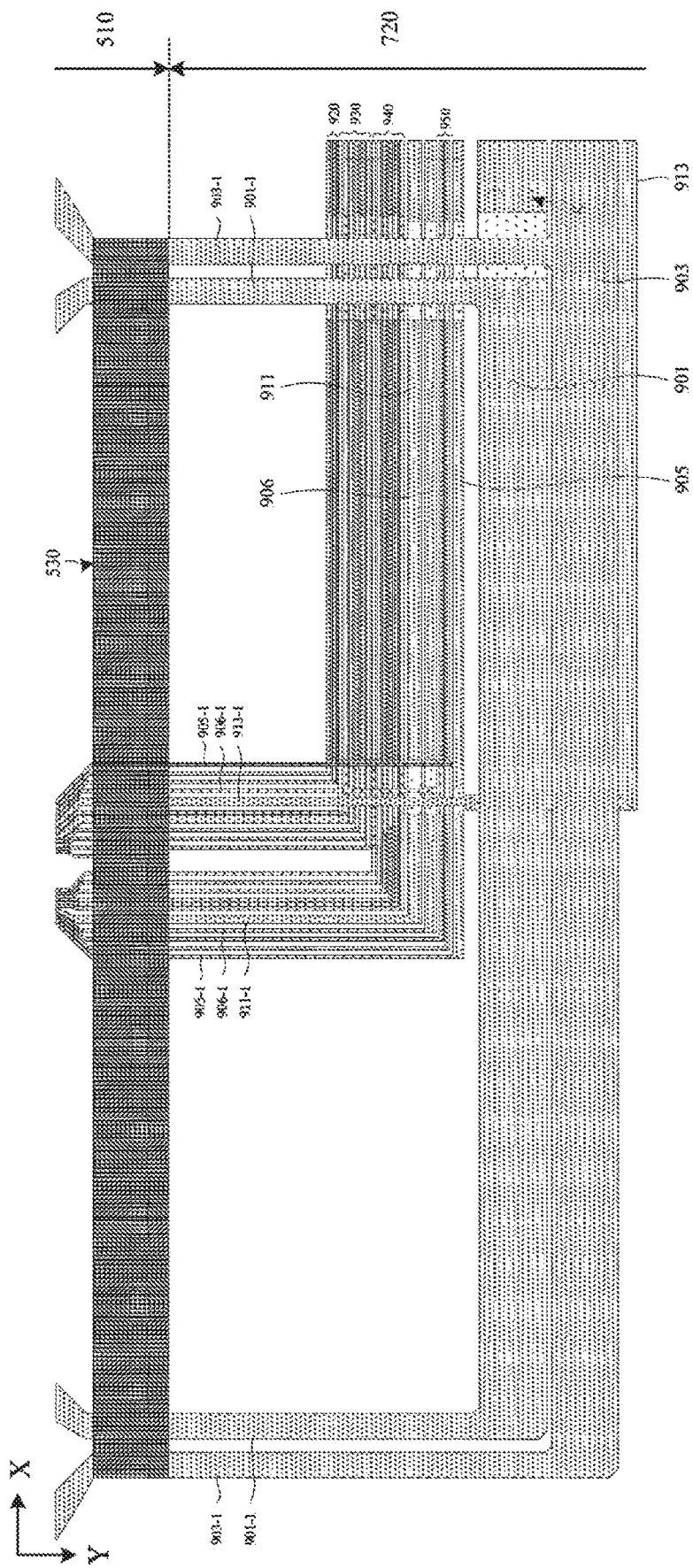
FIG. 16 is a schematic diagram of a structure of another test wire region according to an exemplary embodiment of the present disclosure.

FIG. 16 is a schematic diagram of a structure of another test wire region according to an exemplary embodiment of the present disclosure, which is a wire structure of an area of the test wire region corresponding to a first display substrate. As shown in FIG. 16, in an exemplary implementation, the test wire region 720 may be on a side of the first display substrate 510 in the substrate area in the second direction Y and the test wire region 720 may include multiple wire groups and multiple power supply wires. The multiple wire groups may at least include a second wire group 920, a third wire group 930, a fourth wire group 940, and a fifth wire group 950, and multiple signal wires in the multiple wire groups extend along the first direction X. The multiple power supply wires may at least include a first power supply wire 901, a third power supply wire 903, a fifth power supply wire 905, a sixth power supply wire 906, an eleventh power supply wire 911, and a thirteenth power supply wire 913 extending along the first direction X.

In an exemplary implementation, the second wire group 920, the third wire group 930, the fourth wire group 940, and the fifth wire group 950 may be provided sequentially in a direction away from the second display substrate 520. The eleventh power supply wire 911, the sixth power supply wire 906, the fifth power supply wire 905, the first power supply wire 901, the third power supply wire 903 and the thirteenth power supply wire 913 may be provided sequentially in the direction away from the second display substrate 520. The eleventh power supply wire 911 may be provided on a side of the fourth wire group 940 away from the second display substrate 520, and the fifth wire group 950 may be provided between the fifth power supply wire 905 and the sixth power supply wire 906.

In an exemplary implementation, second ends of the first power supply wire 901, the third power supply wire 903, the fifth power supply wire 905, the sixth power supply wire 906, the eleventh power supply wire 911, and the thirteenth power supply wire 913 extend to corresponding areas of the first display substrate after passing corresponding areas of the second display substrate, and are connected correspondingly to multiple test pins 530 of the first display substrate.

In an exemplary implementation, the third power supply wire 903 may be connected correspondingly to multiple test pins 530 of the first display substrate through at least two third connection lines 903-1. The at least two third connection lines 903-1 may be respectively provided on two sides of the first direction X of the first display substrate. First ends of two third connection lines 903-1 are connected respectively to the third power supply wire 903, and second ends of the two third connection lines 903-1 are connected respectively to test pins 530 on two sides of the first display substrate 510 in the first direction X after extending in a direction close to the first display substrate 510 (a direction opposite to the second direction Y) to form a U-shaped connection structure.

In an exemplary implementation, the first power supply wire 901 may be connected correspondingly to multiple test pins 530 of the first display substrate through at least two first connection lines 901-1. The at least two first connection lines 901-1 may be respectively provided on inner sides the two third connection lines 903-1. First ends of two first connection lines 901-1 are connected respectively with the first power supply wire 901, second ends of the two first connection lines 901-1 are connected respectively with test pins 530 on two sides of the first display substrate 510 in the first direction X after extending in the direction close to the first display substrate 510 to form a "U"-shaped connection structure, and the "U"-shaped connection structure formed by the first power supply wire 901 and the two first connection lines 901-1 is nested within the "U"-shaped connection structure formed by the third power supply wire 903 and the two third connection lines 903-1.

In an exemplary implementation, the first power supply wire 901 and the third power supply wire 903 may each be in a shape of a line extending along the first direction X. The first connection lines 901-1 and the third connection lines 903-1 may each be in a shape of a line extending along the second direction Y. The first power supply wire 901 and the first connection lines 901-1 may be provided in a same layer and are interconnected to form an integral structure, and the third power supply wire 903 and the third connection lines 903-1 may be provided in a same layer and are interconnected to form an integral structure.

In an exemplary implementation, since the first power supply wire 901 is on a side of the third power supply wire 903 close to the first display substrate 510, the first power supply wire 901 needs to employ a bridging structure to avoid the third connection lines 903-1. In an exemplary implementation, the first power supply wire 901 may include at least one lapping part. The first power supply wire 901 may be provided in a conductive layer, the at least one lapping part may be provided in another conductive layer, and two ends of the at least one lapping part in the first direction X are connected respectively with the first power supply wire 901 through vias K, and the complete first power supply wire 901 is formed. For example, the at least one lapping part may be provided in the second gate metal layer (GATE2) and the first power supply wire 901 may be provided in the first source-drain metal layer (SD1).

In an exemplary implementation, the eleventh power supply wire 911 may be connected correspondingly to a test pin 530 of the first display substrate through at least one eleventh connection line 911-1. The at least one eleventh connection line 911-1 may be provided in the middle of the first display substrate in the first direction X. A first end of each eleventh connection line 911-1 is connected to the eleventh power supply wire 911, and a second end of the eleventh connection line 911-1 is connected to a test pin 530 in the middle of the first display substrate 510 in the first direction X after extending in the direction close to the first display substrate 510.

In an exemplary implementation, since the eleventh power supply wire 911 is on a side of the first power supply wire 901 close to the first display substrate 510, the eleventh power supply wire 911 needs to employ a bridging structure to avoid the first connection lines 901-1, the third connection lines 903-1, and other connection lines.

In an exemplary implementation, the thirteenth power supply wire 913 may be connected to a test pin 530 of the first display substrate through at least one thirteenth connection line 913-1. The at least one thirteenth connection line 913-1 may be provided in the middle of the first display substrate in the first direction X. A first end of each thirteenth connection line 913-1 is connected to the thirteenth power supply wire 913, and a second end of the thirteenth connection line 913-1 is connected to a test pin 530 in the middle of the first display substrate 510 in the first direction X after extending in the direction close to the first display substrate 510.

In an exemplary implementation, since the thirteenth power supply wire 913 is on a side of the third power supply wire 903 away from the first display substrate 510, the at least one thirteenth connection line 913-1 employs a bridging structure to avoid the first power supply wire 901 and the third power supply wire 903.

In an exemplary implementation, first ends of the fifth power supply wire 905 and the sixth power supply wire 906 are connected to corresponding pads of the test pad region, and second ends of the fifth power supply wire 905 and the sixth power supply wire 906 continue to extend to corresponding areas of the first display substrate after passing corresponding areas of the second display substrate. In a corresponding area of the second display substrate, the fifth power supply wire 905 and the sixth power supply wire 906 are connected correspondingly to test pins 530 of the second display substrate respectively and in a corresponding area of the first display substrate, the fifth power supply wire 905 and the sixth power supply wire 906 are connected correspondingly to test pins 530 of the first display substrate respectively.

In an exemplary implementation, the fifth power supply wire 905 may be connected respectively to test pins 530 of the first display substrate through at least two fifth connection lines 905-1 to form a "U"-shaped connection structure. The sixth power supply wire 906 may be connected respectively to test pins 530 of the first display substrate through at least two sixth connection lines 906-1, and a "U"-shaped connection structure formed by the sixth power supply wire 906 and two sixth connection lines 906-1 is nested within a "U"-shaped connection structure formed by the fifth power supply wire 905 and two fifth connection lines 905-1.

In an exemplary implementation, since the fifth power supply wire 905 and the sixth power supply wire 906 are on the side of the first power supply wire 901 close to the first display substrate 510 and the sixth power supply wire 906 is on a side of the fifth power supply wire 905 close to the first display substrate 510, the fifth power supply wire 905 needs to employ a bridging structure to avoid the first connection lines 901-1 and the third connection lines 903-1 and the sixth power supply wire 906 needs to employ a bridging structure to avoid the first connection lines 901-1, the third connection lines 903-1 and the fifth connection lines 905-1.

In an exemplary implementation, the second wire group 920 may at least include two signal wires extending along the first direction X. First ends of the two signal wires are connected correspondingly to two pads of the second pad group in the test pad region, second ends of the two signal wires are connected correspondingly to test pins of the first display substrate after extending to corresponding areas of the first display substrate through corresponding areas of the second display substrate. One of the signal wires is configured to provide a test signal to multiple sub-pixels of red pixel column and blue pixel column in the first display substrate, and the other signal wire is configured to provide a test signal to multiple sub-pixels of green pixel column in the first display substrate, i.e. a red sub-pixel test signal DR_R and a blue sub-pixel test signal DB_R in the first display substrate employ one signal wire, and a green sub-pixel test signal DG_R in the first display substrate employs another signal wire. In an exemplary implementation, two signal wires in the second wire group 920 employ a bridging structure to avoid corresponding connection lines.

In an exemplary implementation, the third wire group 930, the fourth wire group 940, and the fifth wire group 950 may each include multiple signal wires extending along the first direction X. First ends of the multiple signal wires are connected correspondingly to multiple pads of the third pad group, the fourth pad group, and the fifth pad group in the test pad region, and second ends of the multiple signal wires continue to extend to corresponding areas of the first display substrate after passing corresponding areas of the second display substrate. In a corresponding area of the second display substrate, multiple signal wires are connected respectively to test pins 530 of the second display substrate through connection lines, and in a corresponding area of the first display substrate, multiple signal wires are connected respectively to test pins 530 of the first display substrate through connection lines. In an exemplary implementation, multiple signal wires in the third wire group 930, the fourth wire group 940, and the fifth wire group 950 need to employ a bridging structure to avoid corresponding connection lines, which will not be repeated here.

In an exemplary implementation, the test method of a display motherboard that performs a light-on test or an aging procedure in a Group CT mode according to this exemplary embodiment may include:

an external test device is connected to multiple pads in at least one substrate area, a light-on test signal or an aging procedure signal are provided to cell test circuits of multiple display substrates in the substrate area through the multiple pads, and a light-on test or an aging procedure are performed simultaneously on the multiple display substrates in the substrate area.

In an exemplary implementation, the light-on test signal or the aging procedure signal may at least include a test signal, a gate drive signal, a multiplexing signal, and a DC power supply signal.

As can be seen from the structure and the test method of the display motherboard according to the exemplary embodiments of the present disclosure, by providing the test pad region and the test wire region in the substrate area, the Group CT light-on mode is achieved by the present disclosure, thus efficiencies of an ET light-on test and an aging procedure can be effectively improved, a process time can be reduced, and a production capacity can be effectively enhanced.

In an exemplary implementation, a display substrate is further provided by an exemplary embodiment of the present disclosure and the display substrate is formed by cutting the aforementioned display motherboard.

An exemplary embodiment of the present disclosure further provides a display apparatus, including the aforementioned display substrate. The display apparatus may be any product or component with a display function, such as a mobile phone, a tablet computer, a television, a display, a laptop computer, a digital photo frame, or a navigator.

Those of ordinary skills in the art should understand that modifications or equivalent replacements may be made to the technical solutions of the present disclosure without departing from the essence and scope of the technical solutions of the present disclosure, and shall all fall within the scope of the claims of the present disclosure.

The invention claimed is:

1. A display motherboard, comprising at least one substrate area, wherein each substrate area comprises at least one test pad region, at least one test wire region, and at least two display substrates, each display substrate comprises a display area and a bonding area located on a side of the display area, the display area comprises a plurality of sub-pixels and the bonding area at least comprises a cell test circuit and a plurality of test pins, wherein the cell test circuit is connected to the plurality of test pins and the plurality of sub-pixels; the test pad region comprises a plurality of pads, the test wire region comprises a plurality of signal wires, first ends of the plurality of signal wires are connected correspondingly to the plurality of pads, second ends of the plurality of signal wires extend to the bonding area of the display substrate in the substrate area and are connected correspondingly to the plurality of test pins of the display substrate, the plurality of pads are configured to enable an external test device to provide test signals to the cell test circuit of each display substrate in the substrate area through the plurality of pads, and simultaneously perform a light-on test or an aging procedure on each display substrate in the substrate area;

wherein the substrate area at least comprises a first display substrate and a second display substrate sequentially provided along a first direction, the test wire region is provided on a side of the first display substrate and the second display substrate in a second direction, the test pad region is provided on a side of the second display substrate away from the first display substrate, or the test pad region is provided on a side of the first display substrate away from the second display substrate, and the first direction intersects with the second direction; and the first display substrate and the second display substrate share one test switch signal wire configured to transmit a test switch signal.

2. The display motherboard according to claim 1, wherein the test pad region at least comprises a first pad, a second pad, a third pad, and a fourth pad; the test wire region at least comprises a first power supply wire, a second power supply wire, a third power supply wire, and a fourth power supply wire;

a first end of the first power supply wire is connected to the first pad, a second end of the first power supply wire extends to the first display substrate and is connected to a test pin of the first display substrate, and the first pad is configured to enable the external test device to provide a first power supply signal to the first display substrate through the first pad;

a first end of the second power supply wire is connected to the second pad, a second end of the second power supply wire extends to the second display substrate and is connected to a test pin of the second display substrate, and the second pad is configured to enable the external test device to provide a first power supply signal to the second display substrate through the second pad;

a first end of the third power supply wire is connected to the third pad, a second end of the third power supply wire extends to the first display substrate and is connected to a test pin of the first display substrate, and the third pad is configured to enable the external test device to provide a second power supply signal to the first display substrate through the third pad; and a first end of the fourth power supply wire is connected to the fourth pad, a second end of the fourth power supply wire extends to the second display substrate and is connected to a test pin of the second display substrate, and the fourth pad is configured to enable the external test device to provide a second power supply signal to the second display substrate through the fourth pad.

3. The display motherboard according to claim 2, wherein at least one signal wire of the test wire region is in a single-layer wire structure, a double-layer wire structure, or a wire structure of more than three layers.

4. The display motherboard according to claim 2, wherein the first power supply wire and the third power supply wire are provided on a side of the second power supply wire and the fourth power supply wire away from the display substrate.

5. The display motherboard according to claim 2, wherein a width of the first power supply wire is greater than a width of the second power supply wire, and a width of the third power supply wire is greater than a width of the fourth power supply wire, and a width is a smallest dimension of each of the first power supply wire, the second power supply wire, the third power supply wire, and the fourth power supply wire in the second direction respectively.

6. The display motherboard according to claim 2, wherein the test pad region further comprises a fifth pad and a sixth pad and the test wire region further comprises a fifth power supply wire and a sixth power supply wire;

a first end of the fifth power supply wire is connected to the fifth pad, a second end of the fifth power supply wire is connected to test pins of the first display substrate and the second display substrate respectively after extending to the first display substrate and the second display substrate, and the fifth pad is configured to enable the external test device to provide a high-level signal to the first display substrate and the second display substrate through the fifth pad; and a first end of the sixth power supply wire is connected to the sixth pad, a second end of the sixth power supply wire is connected to test pins of the first display substrate and the second display substrate respectively after extending to the first display substrate and the second display substrate, and the sixth pad is configured to enable the external test device to provide a low-level signal to the first display substrate and the second display substrate through the sixth pad.

7. The display motherboard according to claim 6, wherein the fifth power supply wire and the sixth power supply wire are provided on a side of the second power supply wire close to the display substrate.

8. The display motherboard according to claim 2, wherein the test pad region further comprises an eleventh pad, a twelfth pad, a thirteenth pad, and a fourteenth pad; the test wire region further comprises an eleventh power supply wire, a twelfth power supply wire, a thirteenth power supply wire, and a fourteenth power supply wire;
- a first end of the eleventh power supply wire is connected to the eleventh pad, a second end of the eleventh power supply wire extends to the first display substrate and is connected to a test pin of the first display substrate, and the eleventh pad is configured to enable the external test device to provide a first initial signal to the first display substrate through the eleventh pad;
- a first end of the twelfth power supply wire is connected to the twelfth pad, a second end of the twelfth power supply wire extends to the second display substrate and is connected to a test pin of the second display substrate, and the twelfth pad is configured to enable the external test device to provide a first initial signal to the second display substrate through the twelfth pad;
- a first end of the thirteenth power supply wire is connected to the thirteenth pad, a second end of the thirteenth power supply wire extends to the first display substrate and is connected to a test pin of the first display substrate, and the thirteenth pad is configured to enable the external test device to provide a second initial signal to the first display substrate through the thirteenth pad; and
- a first end of the fourteenth power supply wire is connected to the fourteenth pad, a second end of the fourteenth power supply wire extends to the second display substrate and is connected to a test pin of the second display substrate, and the fourteenth pad is configured to enable the external test device to provide a second initial signal to the second display substrate through the fourteenth pad.

9. The display motherboard according to claim 8, wherein the eleventh power supply wire, the twelfth power supply wire, and the fourteenth power supply wire are provided on a side of the second power supply wire close to the display substrate and the thirteenth power supply wire is provided on a side of the third power supply wire away from the display substrate.

10. The display motherboard according to claim 8, wherein a width of the eleventh power supply wire is greater than a width of the twelfth power supply wire, a width of the thirteenth power supply wire is greater than a width of the fourteenth power supply wire, and a width is a smallest dimension of each of the eleventh power supply wire, the twelfth power supply wire, the thirteenth power supply wire, and the fourteenth power supply wire in the second direction respectively.

11. The display motherboard according to claim 2, wherein the test pad region further comprises a first pad group, a second pad group, a third pad group, a fourth pad group, and a fifth pad group and the test wire region further comprises a first wire group, a second wire group, a third wire group, a fourth wire group, and a fifth wire group;
- first ends of a plurality of signal wires in the first wire group are connected correspondingly to a plurality of pads in the first pad group, second ends of the plurality of signal wires in the first wire group extend to the second display substrate and are connected correspondingly to a plurality of test pins of the second display substrate, and the first pad group is configured to enable the external test device to provide a test signal to the second display substrate through the first pad group;
- first ends of a plurality of signal wires in the second wire group are connected correspondingly to a plurality of pads in the second pad group, second ends of the plurality of signal wires in the second wire group extend to the first display substrate and are connected correspondingly to a plurality of test pins of the first display substrate, and the second pad group is configured to enable the external test device to provide a test signal to the first display substrate through the second pad group;
- first ends of a plurality of signal wires in the third wire group are connected correspondingly to a plurality of pads in the third pad group, second ends of the plurality of signal wires in the third wire group extend to the first display substrate and the second display substrate and are connected correspondingly to a plurality of test pins of the first display substrate and the second display substrate respectively, and the third pad group is configured to enable the external test device to provide a selection signal to the first display substrate and the second display substrate through the third pad group;
- first ends of a plurality of signal wires in the fourth wire group are connected correspondingly to a plurality of pads in the fourth pad group, second ends of the plurality of signal wires in the fourth wire group extend to the first display substrate and the second display substrate and are connected correspondingly to a plurality of test pins of the first display substrate and the second display substrate respectively, and the fourth pad group is configured to enable the external test device to provide a gate drive signal to the first display substrate and the second display substrate through the fourth pad group; and
- first ends of a plurality of signal wires in the fifth wire group are connected correspondingly to a plurality of pads in the fifth pad group, second ends of the plurality of signal wires in the fifth wire group extend to the first display substrate and the second display substrate and are connected correspondingly to a plurality of test pins of the first display substrate and the second display substrate respectively, and the fifth pad group is configured to enable the external test device to provide a test switch signal to the first display substrate and the second display substrate through the fifth pad group.

12. The display motherboard according to claim 11, wherein the second wire group is provided on a side of the first wire group away from the display substrate, the third wire group is provided on a side of the second wire group away from the display substrate, the fourth wire group is provided on a side of the third wire group away from the display substrate, and the fifth wire group is provided between the fifth power supply wire and the sixth power supply wire.

13. The display motherboard according to claim 11, wherein the test pad region further comprises a plurality of electrostatic discharge units, first ends of the plurality of electrostatic discharge units are connected respectively to a plurality of pads in the first pad group, the second pad group, the third pad group, the fourth pad group, and the fifth pad group, and second ends of the plurality of electrostatic discharge units are connected respectively to first ends of a plurality of signal wires in the first wire group, the second wire group, the third wire group, the fourth wire group, and the fifth wire group.

14. The display motherboard according to claim 1, wherein at least one of the pads has a rectangular shape, a length L of the pad is 300 μm to 1200 μm, a width of the pad is 80 μm to 1200 μm, and a spacing between adjacent pads is 150 μm to 1500 μm.

15. The display motherboard according to claim 14, wherein the pads comprise probe-type pads, a length of each probe-type pad is 400 μm to 1200 μm, a width of the probe-type pad is 400 μm to 1200 μm, and a spacing between adjacent probe-type pads is 100 μm to 1500 μm.

16. The display motherboard of claim 14, wherein the pads comprise crimping-type pads, a length of each crimping-type pad is 300 μm to 1000 μm, a width of the crimping-type pad is 80 μm to 250 μm, and a spacing between adjacent crimping-type pads is 50 μm to 300 μm.

17. A test method of a display motherboard, the display motherboard is the display motherboard according to claim 1, the test method comprising:

an external test device is connected to a plurality of pads in at least one substrate area, a light-on test signal or an aging procedure signal are provided to cell test circuits of the plurality of display substrates in the substrate area through the plurality of pads, and simultaneously performs light-on test or the aging procedure on the plurality of display substrates in the substrate area.

18. A display substrate, wherein the display substrate is configured to be formed by cutting the display motherboard according to claim 1.

19. A display apparatus, comprising the display substrate according to claim 18.

* * * * *